(12) United States Patent
Matsui

(10) Patent No.: US 6,404,673 B1
(45) Date of Patent: Jun. 11, 2002

(54) MAGNETIC MEMORY DEVICE AND METHOD OF READING DATA IN MAGNETIC MEMORY DEVICE

(75) Inventor: Noriyuki Matsui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/810,406

(22) Filed: Mar. 19, 2001

(30) Foreign Application Priority Data

Jul. 27, 2000 (JP) ........................................ 2000-227728

(51) Int. Cl.⁷ .............................................. G11C 11/15
(52) U.S. Cl. ...................... 365/173; 365/171; 365/232; 365/158
(58) Field of Search ................................. 365/173, 171, 365/232, 158, 66, 74

(56) References Cited

U.S. PATENT DOCUMENTS 6,256,224 B1 * 7/2001 Perner et al. ................. 365/173

FOREIGN PATENT DOCUMENTS

| JP | 5-266651 | 10/1993 |
| JP | 9-91950 | 4/1997 |
| JP | 9-509775 | 9/1997 |
| JP | 10-247381 | 9/1998 |
| JP | 11-176149 | 7/1999 |
| JP | 11-265570 | 9/1999 |
| JP | 11-317071 | 11/1999 |
| WO | 95/10112 | 4/1995 |

* cited by examiner

Primary Examiner—David Nelms
Assistant Examiner—David Lam
(74) Attorney, Agent, or Firm—Staas & Halsey LLP

(57) ABSTRACT

There is disclosed a structure of a magnetic memory device for writing/reading data to/from a magnetic memory cell including a plurality of magnetic layers. The magnetic memory device includes a plurality of magnetic memory cells, each magnetic memory cell being formed to have at least three magnetic layers. The plurality of magnetic memory cells are laid out along crossings between a plurality of first lines and a plurality of second lines that cross the first lines, respectively. The magnetic memory device selectively passes a current through the first lines and the second lines, and controls directions of magnetic moments of the first, second and third magnetic layers. Thus, the magnetic memory device writes data into a specific magnetic memory cell. In this structure, each of the first lines comprises at least two word lines. Each word line individually controls a direction of a magnetic moment of any one of the first, second and third magnetic layers, thereby to store data of two or more values in the specific magnetic layer. Preferably, there is provided a method of reading data in the above magnetic memory device.

14 Claims, 19 Drawing Sheets

MAGNETIC MEMORY DEVICE AND METHOD OF READING DATA IN MAGNETIC MEMORY DEVICE

BACKGROUND OF THE INVENTION

1. Filed of the Invention

The present invention relates to a magnetic memory device capable of writing and reading data (information) by utilizing a magnetoresistive effect in each of a plurality of magnetic memory cells that are disposed in a matrix form, each magnetic memory cell having a plurality of magnetic layers laminated in a state that these magnetic layers are partitioned by a non-magnetic layers. The present invention also relates to a method of reading data in this magnetic memory device.

In recent years, the above-described magnetic memory device has come to attract attention as a nonvolatile high-density memory. Each of the plurality of magnetic memory cells that constitute a main part of the magnetic memory device is generally formed by having a plurality of magnetic layers laminated in a state that the magnetic layers are partitioned by non-magnetic layers. For example, each magnetic memory cell is formed by two ferromagnetic layers made of thin films of ferromagnetic material that are partitioned by a non-magnetic layer. This magnetic memory device has a function of writing data into a memory cell at an operational position (an address) and reading data from this memory cell, like a DRAM (dynamic random access memory) that has a plurality of memory cells. Thus, this magnetic memory device is also called an MRAM (magnetic random access memory).

In more detail, a resistance due to the magnetoresistive effect of the magnetic memory cell is different depending on whether magnetic moments of the two ferromagnetic layers included in the magnetic memory cell are mutually in parallel directions or in anti-parallel directions. Data of either "0" or "1" is stored in the magnetic memory cell according to the value of the resistance.

The operation of writing data into the magnetic memory cell is executed by first passing a current through a current line (for example, a word line or a bit line) provided near one of the two ferromagnetic layers. Then, an inversion or a non-inversion of a direction of a magnetic moment of this ferromagnetic layer is controlled based on a magnetic field generated by this current. On the other hand, the operation of reading data from the magnetic memory cell is executed by utilizing the fact that the resistance of the magnetic memory cell is smaller when the magnetic moments of the two ferromagnetic layers are mutually in parallel directions than when the magnetic moments of the two ferromagnetic layers are mutually in anti-parallel directions. In other words, the data read operation is executed by first detecting a relative resistance of the magnetic memory cell based on a flow of a very small current (or fine current) in a direction horizontal to the two ferromagnetic layers, or a flow of a very small current in a direction vertical to the two ferromagnetic layers. Next, a result of this detection is amplified by a sense amplifier, and a decision is made on the data "0" or "1".

2. Description of the Related Art

In order to facilitate understanding of problems of a conventional magnetic memory device, the principle of the operation of a magnetic memory device generally used and conventional examples of a magnetic memory device having a layout of a plurality of magnetic memory cells will be explained below, with reference to FIG. 1 to FIG. 3 that will be described later in "BRIEF DESCRIPTION OF THE DRAWINGS".

A schematic diagram showing the principle of the operation of a magnetic memory cell that utilizes a general magnetoresistive effect, is illustrated in FIG. 1. A perspective view showing a structure of a first example of a conventional magnetic memory device is illustrated in FIG. 2. A perspective view showing a structure of a second example of a conventional magnetic memory device is illustrated in FIG. 2. FIG. 2 and FIG. 3 show structures of a main part of the magnetic memory device, respectively.

Portion (a) to portion (c) of FIG. 1 show a sequence of executing a data write operation to a magnetic memory cell 200 having a structure that two ferromagnetic layers made of thin films of a ferromagnetic material are partitioned by a non-magnetic layer. In general, a thin film of ferromagnetic material is manufactured of Permalloy (usually expressed as Ni-Fe/Co) added with a small volume of cobalt, and a non-magnetic layer is manufactured of aluminum oxide (usually expressed as $Al_2O_3$). The magnetic memory cell 200 that includes the two ferromagnetic layers and one non-magnetic layer has such a structure that, on a first magnetic layer 201 at a lower-layer portion within the two ferromagnetic layers, a second magnetic layer 202 at an upper-layer portion is laminated via a non-magnetic layer 203.

As shown in portion (d) and portion (e) of FIG. 1, there arises a difference in the magnetoresistive effect due to the magnetic mutual operation between the first magnetic layer 201 and the second magnetic layer 202, depending on whether the magnetic moments of the first magnetic layer 201 and the second magnetic layer 202 are mutually in parallel directions or in anti-parallel directions. As a result, there arises a difference in the resistance of the magnetic memory cell 200. More specifically, when the magnetic moments of the first magnetic layer 201 and the second magnetic layer 202 are mutually in parallel directions ((d) in FIG. 1), this resistance becomes smaller than when the first magnetic layer 201 and the second magnetic layer 202 are mutually in anti-parallel directions ((e) in FIG. 1). Data "0" or "1" is stored in the magnetic memory cell corresponding to the value of this resistance.

Assume a state that the magnetic moments of the first magnetic layer 201 and the second magnetic layer 202 are mutually in parallel directions. For example, assume a state that the data of "0"has been stored in advance, before data is written into the magnetic memory cell 200, as shown in portion (a) of FIG. 1. The operation of writing data "1" into the magnetic memory cell 200 in this state is executed by first passing a current through a current line (for example, a word line or a bit line) 204 provided near the second magnetic layer 202. Then, a direction of the magnetic moment of the second magnetic layer 202 is inverted based on a magnetic field B generated by this current, as shown in portion (b) of FIG. 1. Thereafter, the direction of the magnetic moment of the second magnetic layer 202 maintains the invented state even after the current of the current line 204 has been set to be zero and the magnetic field B has been removed, as shown in portion (c) of FIG. 1. Therefore, the data of "1" is stored in the magnetic memory cell. In this case, a component ratio of each element (iron, nickel, cobalt, etc.) of the magnetic material for the first magnetic layer 201 and the second magnetic layer 202 is changed in advance so that the magnetic moment of the second magnetic layer 202 is inverted in a magnetic field smaller than that of the first magnetic layer 201. Based on this arrangement, it becomes easy to invert only the magnetic moment of the upper-layer second magnetic layer 202, without influencing the magnetic moment of the lower-layer first magnetic layer 201.

On the other hand, for executing the operation of reading data stored in the magnetic memory cell 200, a fine current is supplied to the magnetic memory cell 200 from a power source Vd via a current line 204, as shown in portions (d) and (e) of FIG. 1. Based on this current supply, a difference between two resistances is detected as follows. That is, a difference is detected between the resistance of the magnetic memory cell 200 when the magnetic movements of the first magnetic layer 201 and the second magnetic layer 202 are mutually in parallel directions and the resistance of the magnetic memory cell 200 when these magnetic moments are mutually in anti-parallel directions. Based on this, a decision is made as to whether the data in "0" or "1".

In a spin-valve type ferromagnetic memory device 100 as a first conventional example shown in FIG. 2, a data read operation is carried out by passing a current in a direction horizontal to two ferromagnetic layers within the magnetic memory cell 200. In this case, a relative resistance that is generated due to a giant magnetoresistance effect (usually abbreviated to a GMR) of the two ferromagnetic layers is detected. On the other hand, in a tunneling-type ferromagnetic memory device 101 as a second conventional example shown in FIG. 3, a data read operation is carried out by passing a current in a direction vertical to two ferromagnetic layers within the magnetic memory cell 200. In this case, a relative resistance that is generated due to a tunneling magnetoresistive effect (usually abbreviated to a TMR) of the two ferromagnetic layers is detected.

More specifically, a plurality of magnetic memory cells 200 are prepared in the magnetic memory devices of the first and second conventional examples, respectively. These magnetic memory cells are disposed in a matrix form of points where a plurality of word lines (only w0 and w1 are shown here) and a plurality of bit lines (only b0, b1 and b2 are shown here) cross.

In the spin-valve type ferromagnetic memory device 100 as the first conventional example shown in FIG. 2, the magnetic memory cells that are disposed corresponding to the crossings between the word lines w0 and w1 and the bit lines b0, b1 and b2 are defined as MS11, MS12, MS13, MS21, MS22 and MS23, respectively. Current guide portions 205 are formed on both ends of each of these magnetic memory cells MS11 to MS23, respectively. For reading data from a certain magnetic memory cell as a target cell of the data reading, a word line and a bit line located at the corresponding magnetic memory cell are selected respectively. Further, the selected word line and bit line are set to a predetermined potential, and a current I flows in a direction parallel to the ferromagnetic layers within this magnetic memory cell via the current guide portions 205. Further, a sense amplifier or the like amplifies the current that flows out from this magnetic memory cell, and this current is compared with a reference current. Then, a relative resistance of this magnetic memory cell is detected, and the data "0" or "1" is determined.

On the other hand, in the tunneling-type ferromagnetic memory device 101 as the second conventional example shown in FIG. 3, the magnetic memory cells that are disposed corresponding to the crossings between the word lines w0 and w1 and the bit lines b0, b1 and b2 are defined as MT11, MT12, MT13, MT21, MT22 and MT23, respectively. In this case, the word lines and the bit liens are directly connected to the lower-layer portions and the upper-layer portions of the magnetic memory cells MT11 to MT23, respectively, unlike in the above first conventional example. For reading data from a certain magnetic memory cell as a target cell of the data reading, a word line and a bit line located at the corresponding magnetic memory cell are selected respectively. Further, the selected word line and bit line are set to a predetermined potential, and a current I flows in a direction vertical to the ferromagnetic layers within this magnetic memory cell. Further, a sense amplifier or the like amplifies the current that flows out from this magnetic memory cell, and this current is compared with a reference current. Then, a relative resistance of this magnetic memory cell is detected, and the data "0" or "1" is determined.

As explained above, according to the conventional magnetic memory device having magnetic memory cells, each in a structure having two ferromagnetic layers laminated together, the data of "0" or "1" is read based on a detection of a current that flows out from the magnetic memory cells.

According to the conventional magnetic memory device, however, each magnetic memory cell can store only two-valve (two-bit) data "0" or "1". Therefore, when the provision of a memory having a larger memory density than the conventional memory, or a provision of a multi-functional memory has come to be required along the increase in the capacity of a computer system, it is difficult to meet such a requirement.

Further, according to the above magnetic memory device, a current is passed through the word lines and bit lines for writing data into the magnetic memory cells, and a current flowing out from a selected magnetic memory cell is detected for reading data. Therefore, there is an inconvenience in that the total power consumption of the magnetic memory device becomes relatively large.

SUMMARY OF THE INVENTION

The present invention has been made in the light of the above problems. It is, therefore, an object of the invention to provide a magnetic memory device which is capable of realizing magnetic memory cells having a higher recording density than that of the conventional magnetic memory cells, and also capable of realizing multi-functional magnetic memory cells, and also capable of reducing power consumption, and to provide a method of reading data in this magnetic memory device.

In order to achieve the above object, a magnetic memory device of the present invention has a plurality of magnetic memory cells. Each magnetic memory cell is formed to have at least three magnetic layers including a first magnetic layer, a second magnetic layer and a third magnetic layer laminated together. Further, each magnetic memory cell has a resistance that is different depending on directions of magnetic moments of the first, second and third magnetic layers, respectively. The plurality of magnetic memory cells are laid out along crossings between a plurality of first lines and a plurality of second lines that cross the first lines, respectively. The magnetic memory device selectively passes a predetermined current through the first lines and the second lines and controls directions of magnetic moments of the first, second and third magnetic layers, thereby to write data into a specific magnetic memory cells.

In the above structure, each of the first lines consists of at lest two word lines, and each of the word lines individually controls a direction of a magnetic moment of any one of the first, second and third magnetic layers. Thus, data of two or more values is stored in the specific magnetic layer.

Preferably, in the magnetic memory device of the present invention, each of the first lines consists of two word lines.

The two words lines are provided at an upper-layer portion and a lower-layer portion of each of the magnetic memory cells, respectively. In this structure, the word line in the upper-layer portion controls a direction of a magnetic moment of a magnetic layer formed on the upper-layer portion, and the word line in the lower-layer portion controls a direction of a magnetic moment of a magnetic layer formed on the lower-layer portion.

More preferably, in the magnetic memory device of the present invention, each of the second lines consists of two bit lines. The two bits lines are provided at an upper-layer portion and a lower-layer portion of each of the magnetic memory cells, respectively. In this structure, the word line in the upper-layer portion and the bit line in the upper-layer portion control a direction of a magnetic movement of a magnetic layer formed on the upper-layer portion. Further, the word lines in the lower-layer portion and the bit lines in the lower-layer portion control a direction of a magnetic moment of a magnetic layer formed on the lower-layer portion. Thus, multi-value data is stored.

More preferably, in the magnetic memory device of the present invention, in carrying out a data read operation by detecting a difference in the resistance of the magnetic memory cell selected by the first line and the second line, the magnetic memory device controls a direction of a magnetic moment of a magnetic layer of each magnetic memory cell in which there is disposed one word line located at a side not having influence on a current flowing through the second lines, out of the two word lines that constitute the first lines. The magnetic memory device controls the direction for each of this word line.

In a method of carrying out a data read operation (i.e. a method of reading data) by detecting a difference in the resistance of the magnetic memory cell selected by the first line and the second line in the magnetic memory device having the above-described structure, a direction of a magnetic moment of a magnetic layer of each magnetic memory cell in which there is disposed one word line located at a side not having influence on a current flowing through the second line, is controlled of reach of this word line. Further, the direction of the magnetic moment of this magnetic layer corresponds to a selection or non-selection of the magnetic memory cell by the first line.

According to the magnetic memory device and the method of reading data described above, a magnetic layer in which one word line is disposed can have a function equivalent to isolating-diodes or isolating-transistors capable of isolating a plurality of magnetic memory cells from each other. Therefore, it is possible to avoid the necessity of providing the isolating-diodes or the isolating-transistors.

Further, a magnetic memory device of the present invention has a plurality of magnetic memory cells. Each magnetic memory cell is formed to have a plurality of magnetic layers laminated together, and each magnetic memory cell has a resistance that is different depending on directions of magnetic moments of the plurality of magnetic layers. In this structure, the plurality of magnetic memory cells are laid out along crossings between a plurality of first lines and a plurality of second lines that cross the first lines, respectively. Further, voltage reading means (or a voltage reading unit) such as a capacitor having a capacity substantially equal to the capacity of each magnetic memory cell is connected in series with each magnetic memory cell. In the above structure, the magnetic memory device measures a potential at a connection point between one terminal of the magnetic memory cell selected by the first line and the second line and the voltage reading means at a predetermined timing. The magnetic memory device decides a voltage level of this potential, thereby reading the data of this magnetic memory cell.

In a method of carrying out a data read operation by detecting a difference in the resistance of the magnetic memory cell selected by the first line and the second line in the magnetic memory device having the above-described structure, voltage reading means having a capacity substantially equal to the capacity of each magnetic memory cell is connected in series with each magnetic memory cell. Further, a potential at a connection point between one end of the magnetic memory cell selected by the first line and the second line and the voltage reading means is measured at a predetermined timing, thereby deciding on this voltage level.

In summary, according to the present invention, in magnetic memory cells, each having a structure of having at least three magnetic layers laminated together, a direction of a magnetic moment of any one of the at least three magnetic layers is controlled individually using at least two word lines. Based on this arrangement, a specific magnetic memory cell stores data of two or more values. Therefore, it is possible to realize magnetic memory cells having a higher recording density that the conventional magnetic memory cells, as well as multi-functional magnetic memory cells.

Further, according to the present invention, voltage reading means such as a capacitor is connected in series with magnetic memory cells, each having a plurality of magnetic layers laminated together. Data of a magnetic memory cell is read by deciding a voltage level obtained by charging this voltage reading means. Therefore, it is possible to reduce power consumption to a lower level than has been required conventionally.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Structure and operations of preferred embodiments of the present invention will be explained below with reference to the attached drawings (FIG. 4 to FIG. 21).

Figure 4:
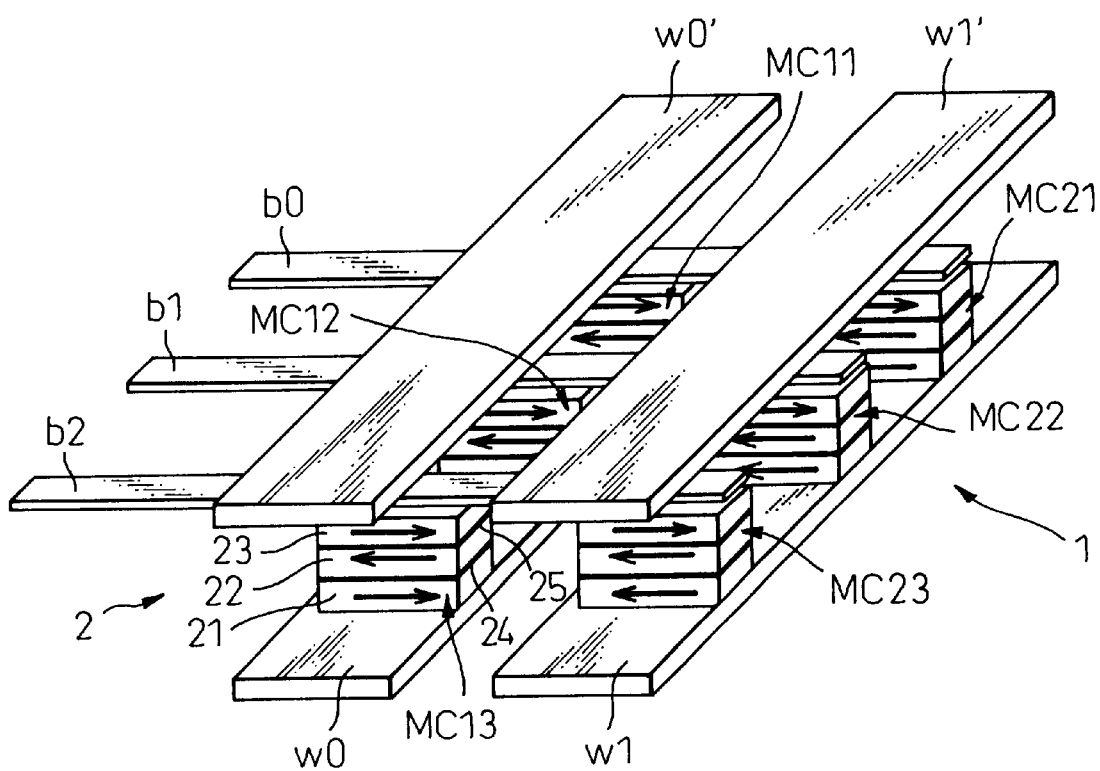
FIG. 4 is a perspective view showing a main part of a first preferred embodiment of the present invention.

FIG. 4 is a perspective view showing a main part of a first preferred embodiment (hereinafter referred to as a first embodiment) of the present invention. FIG. 4 shows a simplified structure of a main part of a magnetic memory device relating to the first embodiment of the present invention. Constituent elements similar to those explained before will have identical reference numbers attached.

A magnetic memory device 1 relating to the first embodiment shown in FIG. 4 includes a three-layer magnetic memory cell 2 having a laminated structure of a first magnetic layer 21 at a lower-layer portion, a second magnetic layer 22 at an intermediate-layer portion, and a third magnetic layer 23 at an upper-layer portion. A first non-magnetic layer 24 is formed between the first magnetic layer 21 and the second magnetic layer 22 within this magnetic memory cell, for electrically and magnetically isolating these magnetic layers. Further, a second non-magnetic layer 25 is formed between the second magnetic layer 22 and the third magnetic layer 23. Preferably, thin films of ferromagnetic material forming the first to third magnetic layers are manufactured of Permalloy (Ni-Fe/Co) added with a small volume of cobalt, and thin films of non-magnetic material forming the first and second non-magnetic layer are manufactured of aluminum oxide ($Al_2O_3$).

Figure 1:
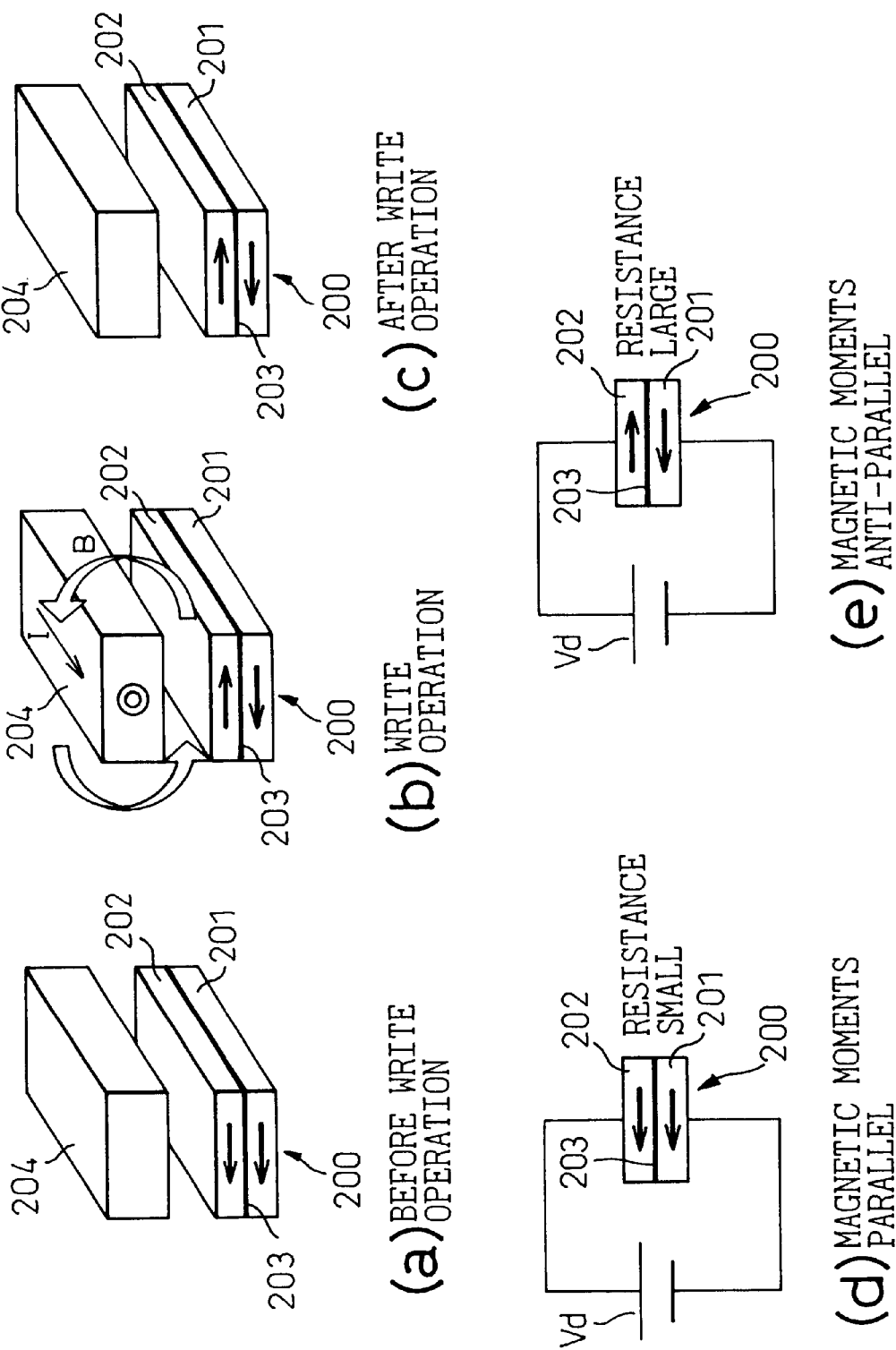
FIGS. 1a–e is a schematic diagram showing the principle of the operation of a magnetic memory cell that utilizes a general magnetoresistive effect.
Figure 2:
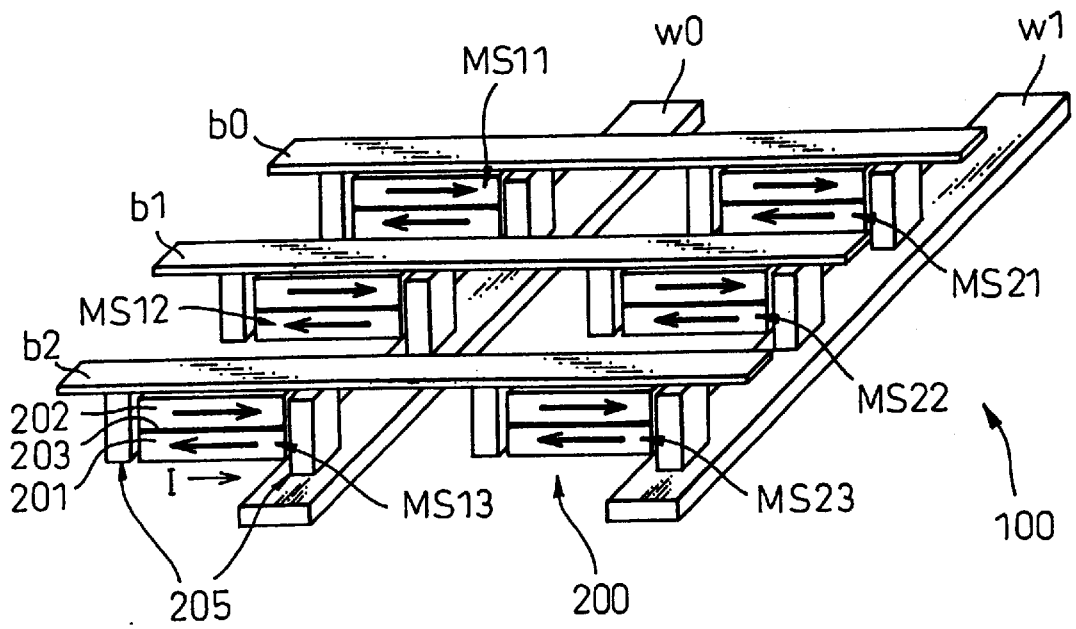
FIG. 2 is a perspective view showing a structure of a first example of a conventional magnetic memory device.
Figure 3:
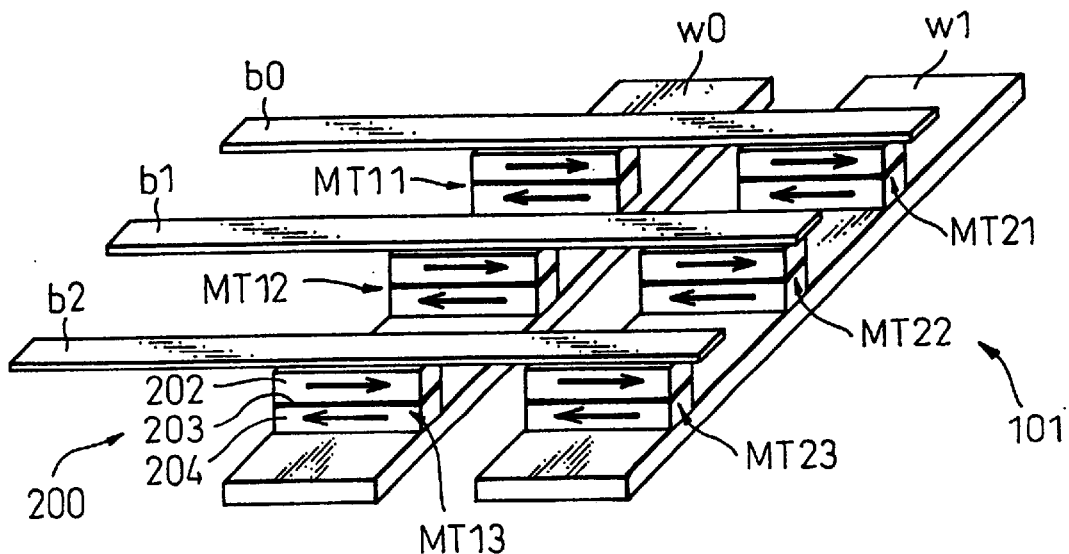
FIG. 3 is a perspective view showing a structure of a second example of a conventional magnetic memory device.

In general, a tunneling-type ferromagnetic memory device (refer to FIG. 3) that carries out a data read operation by passing a current in a direction vertical to ferromagnetic layers within a magnetic memory cell has a larger change in the resistance for the data "0" or "1", with a more satisfactory sensitivity of the data reading, than a spin-valve type ferromagnetic memory device (refer to FIG. 2) that carries out a data read operation by passing a current in a direction horizontal to ferromagnetic layers within a magnetic memory cell. Therefore, in the first embodiment shown in FIG. 4, a tunneling-type ferromagnetic memory device is used as the magnetic memory device 1.

In the first embodiment shown in FIG. 4, a plurality of magnetic memory cells 2 are prepared. The plurality of magnetic memory cells are disposed in a matrix form along crossings between a plurality of word lines (only w0 and w1 are shown here) and a plurality of control word lines (only 10' and w1' are shown here), and a plurality of bit lines (only b0, b1, and b2 are shown here) that cross these two kinds of word lines w0, w1, w0' and W1'. More specifically, the plurality of word lines w0 and w1 are provided at the lower-layer portion of the magnetic memory cell, and the plurality of control word lines w0' and w1' are provided at the upper-layer portion of the magnetic memory cell. In this case, the three-layer magnetic memory cells that are disposed corresponding to the crossings between the word lines w0 and w1 (or the control word lines w0' and w1') and the bit lines b0, b1 and b2 are defined as MC11, MC12, MC13, MC21, MC22, and MC23, respectively. Further, in the magnetic memory device of the present invention, first lines are structured by the plurality of word lines w0 and w1 and the control word lines w0' and w1', and second lines are structured by the plurality of bit lines b0, b1 and b2.

Further, in the first embodiment shown in FIG. 4, a predetermined current flows through the word lines w0 and w1 so that these word lines generate a magnetic field. With this arrangement, a direction of a magnetic moment of the first magnetic layer 21 formed at the lower-layer portion of each of the three-layer magnetic memory cells is controlled. On the other hand, a predetermined current flows through the control word lines w0' and w1' so that these control word lines generate a magnetic field. With this arrangement, a direction of a magnetic moment of the third magnetic layer 23 formed at the upper-layer portion of each of the three-layer magnetic memory cells is controlled. For writing data to a specific three-layer magnetic memory cell, one of the control word lines w0' and w1' is selected, and at the same time, one of the bit lines b0, b1 and b2 that crosses the control word lines w0' and w1' and that is also adjacently provided is selected. Further, a predetermined current is also passed simultaneously through the control word line and the bit line that have been selected in this way, thereby to generate a combined magnetic field. Based on this arrangement, a direction of a magnetic moment of the third magnetic layer 23 formed at the upper-layer portion of the three-layer magnetic memory cell that is positioned at the crossing between the selected control word line and the selected bit line, is controlled.

Further, a magnetic moment of the second magnetic layer 22 denotes at the intermediate-layer portion can be controlled to face a constant direction, by generating a ferromagnetic field based on a relatively large current using either one or both of the control word line at the upper-layer portion and the word line at the lower-layer portion. When the second magnetic layer 22 has been once magnetized to determine a direction of its magnetic moment, it is not necessary to apply a ferromagnetic field each time. In this case, the component ratios of the elements of the magnetic materials are changed between the first magnetic layer 21, the third magnetic layer 23 and the second magnetic layer 22, such that the magnetic moments of the first magnetic layer 21 and the third magnetic layer 23 are inverted in a smaller magnetic field than a magnetic field of the second magnetic layer 22. Based on this arrangement, it is possible to independently invert the magnetic moment of the first magnetic layer 21 at the lower-layer portion and the magnetic moment of the third magnetic layer 23 at the upper-layer portion, respectively, without having influence on the magnetic moment of the second magnetic layer 22 at the intermediate-layer portion.

Figure 5:
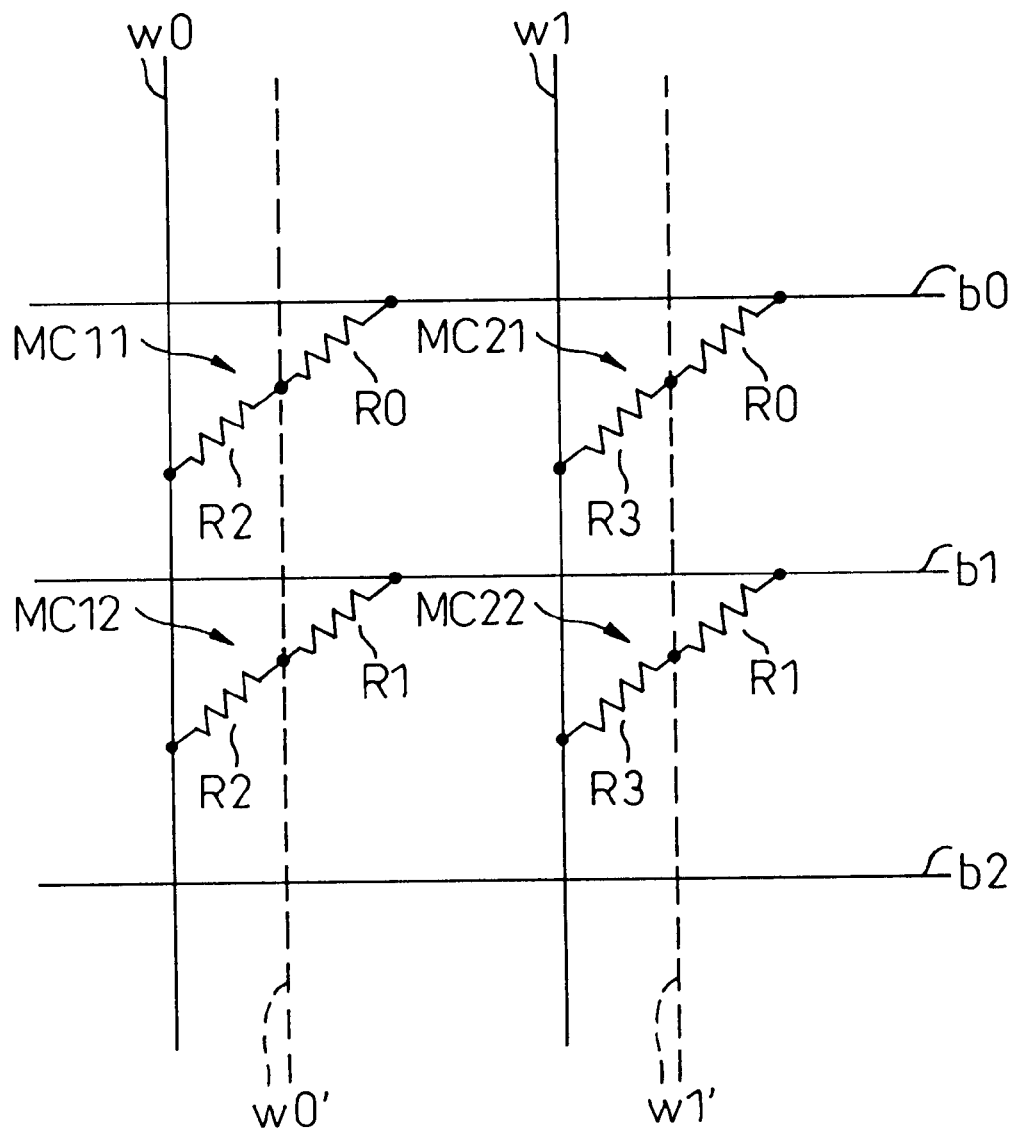
FIG. 5 is a circuit diagram showing an equivalent circuit of a magnetic memory device shown in FIG. 4.
Figure 6:
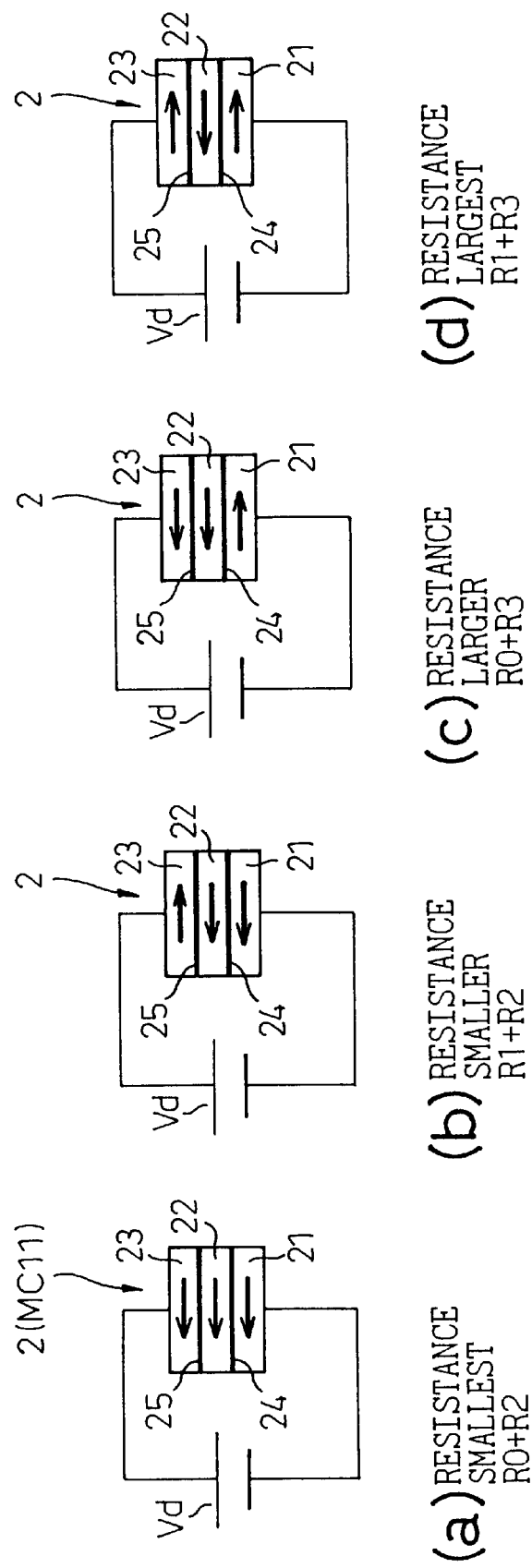
FIGS. 6a–d is a schematic diagram showing a relationship between a direction of a magnetic moment of a magnetic layer and a resistance shown in FIG. 4.

FIG. 5 is a circuit diagram showing an equivalent circuit of the magnetic memory device shown in FIG. 4, and FIG. 6 is a schematic diagram showing a relationship between a direction of a magnetic moment of the magnetic layer shown in FIG. 4 and a resistance. As shown in FIG. 5, according to the directions of the magnetic moments of the first, second and third magnetic layers formed on each of the three-layer magnetic memory cells MC11, MC21, MC12 and MC22, respectively, each portion has the following resistance. That is, the portion including the third magnetic layer 23 at the upper-layer portion has a two-value resistance of R0 and R1 (R0<R1), and the portion including the first magnetic layer 21 at the lower-layer portion has a two-valve resistance of R2 and R3 (R2<R3). In this case, the third magnetic layer 21 at the upper-layer portion is adjacent to both the control word lines w0' and w1' and the bit lines b0, b1 and b2. Therefore, it is possible to invert the direction of the magnetic moment of a specific third magnetic layer 23 that is located at a crossing between a selected control word line and a selected bit line. On the other hand, the first magnetic layer 21 at the lower-layer portion is adjacent to only the word lines w0 and w1. Therefore, the first magnetic layer 21 at the lower-layer portion is not influenced by the current that flows through each of the bit lines b0 and b1 and b2. As a result, a direction of the magnetic moment of the first magnetic layer 21 at the lower-layer portion is controlled by each word line.

In general, for reading data stored in a three-layer magnetic memory cell, a low potential is set to a selected control word line, and a high potential is set to a selected bit line, thereby to supply a fine current to the three-layer magnetic memory cell. With this arrangement, a change in the resistance for the data "0" or "1" is detected. In this case, in order to prevent a simultaneous selection of a plurality of three-layer magnetic memory cells, it is necessary to provide an isolating-diode or an isolating-transistor in series with each of these three-layer magnetic memory cells for isolating the plurality of three-layer magnetic memory cells. In place of the isolating-diode or the isolating-transistor, it is also possible to provide a transfer gate consisting of a plurality of switching transistors. Details of the isolating-diode or the isolating-transistor will be explained later with reference to FIG. 10 and FIG. 11.

In FIG. 5, the resistance of the first magnetic layers at the lower-layer portions of the magnetic memory cells disposed along the selected word line w0 for the data read operation are set to a low level (set to R2). The resistance of the first magnetic layers at the lower-layer portions of the magnetic memory cells disposed along the non-selected word line w1 are set to a high level (set to R3). With this arrangement, it is possible to achieve a function similar to that of the above isolating-diode (or the isolating-transistor).

Preferably, in a magnetic memory device having a structure as shown in FIG. 4 and FIG. 5, the following method of reading data is executed. For carrying out a data read operation by detecting a difference in the resistance of the magnetic memory cell selected by a control word line (or a word line) and a bit line, a direction of a magnetic moment of a magnetic layer of each magnetic memory cell in which there is disposed one word line located at a side not having influence on a current flowing through the control word line (for example, the first magnetic layer at the lower-layer portion), is controlled for each of this word line. Further, the direction of the magnetic moment of this magnetic layer corresponds to a selection or non-selection of the magnetic memory cell by the word line.

FIG. 6 shows a relationship between a direction of a magnetic moment of each of the magnetic layers 21 to 23 of a three-layer magnetic memory cell and a resistance. As is obvious from FIG. 6, when the magnetic moments of the second magnetic layer 22 and the third magnetic layer 23 are mutually in parallel directions, the resistance of the portion including this third magnetic layer 23 becomes R0. When the magnetic moments of the second magnetic layer 22 and the third magnetic layer 23 are mutually in anti-parallel directions, the resistance of the portion including this third magnetic layer 23 becomes R1. The resistance R0 is smaller than the resistance R1 (r0<R1) as explained above. On the other hand, when the magnetic moments of the first magnetic layer 21 and the second magnetic layer 22 are mutually in parallel directions, the resistance of the portion including this first magnetic layer 21 becomes R2. When the magnetic moments of the first magnetic layer 21 and the second magnetic layer 22 are mutually in anti-parallel directions, the resistance of the portion including this first magnetic layer 21 becomes R3. The resistance R2 is smaller than the resistance R3 (R2<R3) as explained above. Therefore, when a current has been passed in a direction vertical to the first to third magnetic layers 21 and 23, respectively, the resistances becomes R0+R2, R1+R2, R0+R3, and R1+R3 according to the directions of the magnetic moments of the first to third magnetic layers 21 to 23, as shown in portions (a) to (d) of FIG. 6. When the resistances R0 to R3 are selected at suitable values as described later, it is possible to set the relationship of the values of these resistances as follows: (R0+R2)<(R1+R2)<(R0+R3)<(R1+R3).

As explained above, the resistance R0 and R1 are determined by the direction of the magnetic moment of the third magnetic layer 23 of the magnetic memory cell that is located at a crossing between the selected control word line and the selected bit line. Therefore, it is possible to make the resistances R0 and R1 correspond to the data "0" and "1", respectively, as shown in portion (a) and portion (b) of FIG. 6. On the other hand, the resistances R2 and R3 are determined according to a selection or non-selection of a word line. Therefore, it is possible to make the resistances R2 and R3 correspond to a word line selection and a word line non-selection, respectively, as shown in portion c) and portions (d) of FIG. 6. In other words, portion (a) of FIG. 6 shows the data of "0" when a word line has been selected, and portion (b) of FIG. 6 shows the data of "1" when a word line has been selected. Further, portion (c) of FIG. 6 shows the data of "0" when a word line has not been selected 9 non-selection 0), and a portion (d) of FIG. 6 shows the data of "1" when a word line has not been selected (non-selection 1).

When the directions of the magnetic moments of the two ferromagnetic layers have changed from the relationship of mutually parallel directions to the relationship of mutually anti-parallel directions (or when the directions of the magnetic moments have changed so as to have the opposite relationship), the change in the resistance is about 30%. From this fact, the resistances R1 and R0 of the portion including the third magnetic layer at the upper-layer portion are selected at the following values, for example.

R0=1 kΩ (kilo ohm)

R1=1.3 kΩ(R1=R0+R0×0.3)

In the meantime, R0+R1, R1+R2, R0+R3, and R1+R3 need to have all different resistances. Further, in order to have uniform intervals between the respective resistances, the resistances R2 and R3 of the portion including the first magnetic layer at the lower-layer portion are selected at the following values.

$$R2=2\ K\Omega$$

$$R3=2.6\ k\Omega (R3=R2+R2\times 0.3)$$

In this case, the resistance of the magnetic memory cell selected for reading the data ranges from 3 kΩ to 3.3 kΩ, based on the following: R0+R1=3 kΩ (1 kΩ+2 kΩ), and R1+R2=3.3 kΩ(1.3 kΩ+2kΩ). On the other hand, the resistance of the magnetic memory cell not selected for reading the data ranges from 3.6 kΩ to 3.9 kΩ, based on the following: R0+R3=3.6 kΩ (1 kΩ+2.6 kΩ), and R1+R3=3.9 kΩ(1.3 kΩ+2.6 kΩ). In other words, the resistances of R0+R1, R1+R2, R0+R3, and R1+R3 are set at equal intervals of 0.3 kΩ.

More specifically, it is preferable that the data of "0" is set to a resistance equal to or smaller than 3.15 kΩ, and the data of "1" is set to a resistance equal to or larger than 3.15 kΩ and equal to or smaller than 3.45 kΩ.

Figure 7:
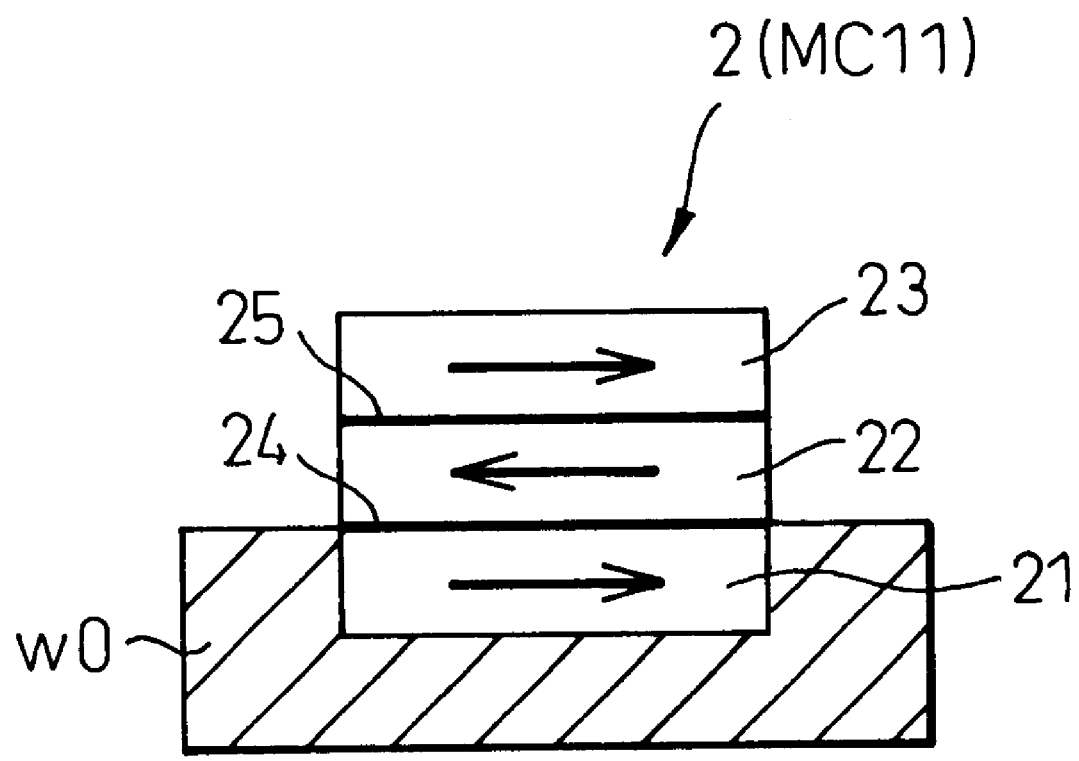
FIG. 7 is a front view showing one example of a shape of a word line used in the embodiment of the present invention.

FIG. 7 is a front view showing one example of the magnetic memory cell used in the embodiment (for example, the above first embodiment) of the present invention. Specifically, FIG. 7 shows an enlarged portion of a crossing between the magnetic memory cell 2 and a word line (for example, the word line w0) shown in FIG. 4.

In FIG. 7, the first magnetic layer 21 at the lower-layer portion of the magnetic memory cell 2 is slightly embedded into the word line w0. In this structure, in the case of inverting a direction of the magnetic moment of the first magnetic layer 21 by passing a current through the word line w0, it is possible to concentrate the magnetic field generated by this current onto the first magnetic layer 21. As a result, it is possible to minimize a leakage of a magnetic flux to other magnetic layers. By concentrating the magnetic field generated by this current onto the first magnetic layer 21, it becomes possible to minimize a leakage of a magnetic flux to other magnetic layers.

Figure 8:
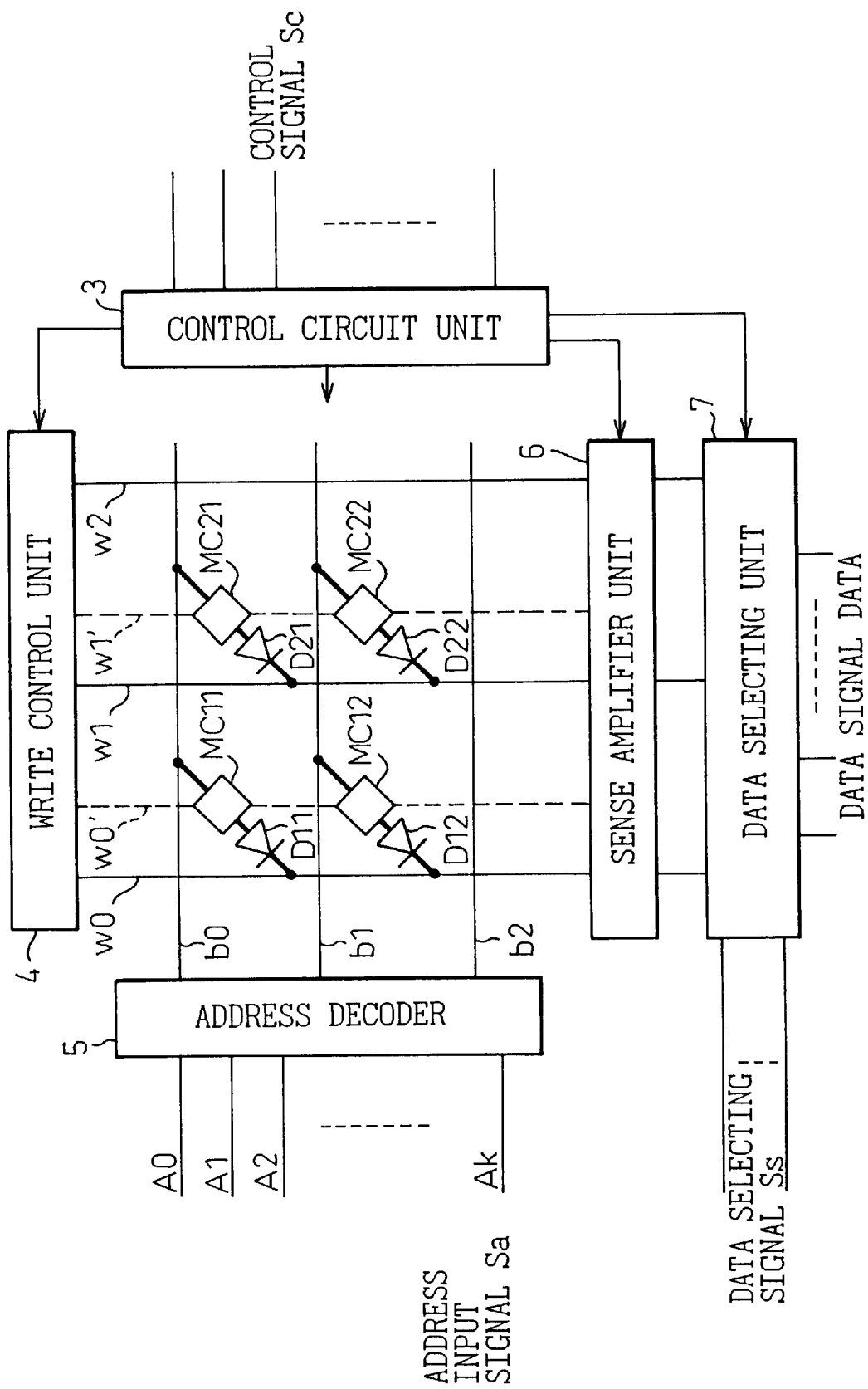
FIG. 8 is a block diagram showing a total structure of a magnetic memory device relating to the embodiment of the present invention.
Figure 9:
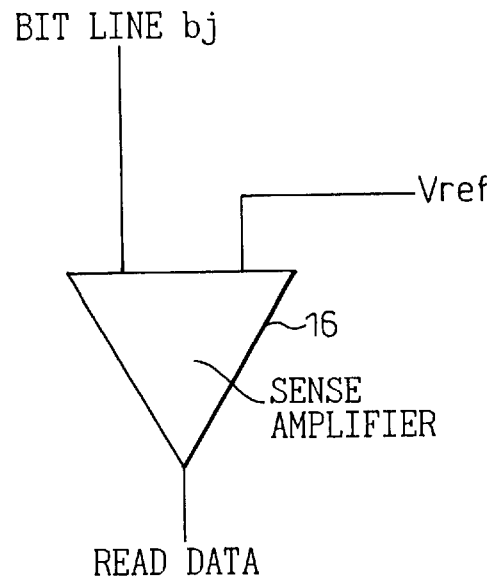
FIG. 9 is a circuit diagram showing one example of a sense amplifier unit shown in FIG. 8.

FIG. 8 is a block diagram showing a total structure of the magnetic memory device relating to the embodiment (for example, the above first embodiment) of the present invention, and FIG. 9 is a circuit diagram showing one example of a sense amplifier unit shown in FIG. 8.

In the magnetic memory device shown in FIG. 8, there is disclosed a structure of a plurality of three-layer magnetic memory cells MC11 to MC22, in a similar structure to that shown in FIG. 4. The three-layer magnetic memory cells MC11 to MC22 are disposed in a matrix form along crossing between a plurality of word lines (w0, w1 and w2) and a plurality of control word lines (w0' and w1'), and a plurality of bit lines (b0, b1 and b2) that cross these word lines and control word lines. However, in order to prevent a plurality of three-layer magnetic memory cells from being selected simultaneously at the time of reading data, isolating-diodes D11, D12, D21 ad D22 for isolating the plurality of three-layer magnetic memory cells from each other are provided in series with the three-layer magnetic memory cells MC11, MC12, MC21 and MC22, respectively.

Further, the magnetic memory device shown in FIG. 8 is provided with a control circuit unit 3 that generates various control signals for making it possible to example a data write operation and a data read operation to the three-layer magnetic memory cells based on control signals Sc supplied from the outside. These control signals include a write control signal for controlling a data write operation to a selected three-layer magnetic memory cell, a read control signal for controlling a data read operation to a selected three-layer magnetic memory cell, and a chip select signal for selecting an address of data that has been read.

Further, the magnetic memory device shown in FIG. 8 is provided with a write control unit 4 that carries out a data write operation by flowing a predetermined current to a word line (or a control word line) and a bit line that have been selected by the write control signal. The magnetic memory device is also provided with a sense amplifier unit 5 that amplifies a current flowing out from a three-layer magnetic memory cell by setting a low potential and a high potential to the word line and the bit line respectively that have been selected by the read control signal. A signal that shows the data of "0" or "1" that has been detected by the sense amplifier unit 5 is input to a data selecting unit 7. The data selecting unit 7 finally confirms that the input data is a correct data, by using a data selecting signal Ss, and then outputs the signal as a data signal DATA.

Further, the magnetic memory device shown in FIG. 8 is provided with an address decoder 5 for decoding address input signals A0 to Ak (where k is an optional positive integer of 2 or above) that are input from the outside. This address decoder 7 sets a high potential to a selected bit line according to a decoded address signal, and passes a current through a low-potential word line selected by the write control unit 4. Thus, it is possible to execute the operation of writing data to or reading data from the corresponding three-layer magnetic memory cell.

As shown in FIG. 9, the sense amplifier unit 5 has a single or a plurality of sense amplifiers 16. In the case of executing the operation of reading data stored in a three-layer magnetic memory device, the sense amplifier unit 5 takes out a fine current that flows through a corresponding bit line bj of the three-layer magnetic memory device, and inputs this current to the sense amplifier 16. The sense amplifier 16 detects a different between the fine current that flows through the bit line bj and a reference current (or a difference between a voltage obtained by converting the fine current into a voltage and reference voltage Vref obtained by converting the reference current into a voltage). The sense amplifier 16 then amplifies this difference, and outputs of read data.

Next, there will be explained in detail, below, the reason why isolating-diodes or isolating-transistors are necessary in order to isolate a plurality of magnetic memory cells, that are disposed in a matrix form in the general magnetic memory device, from each other.

Figure 10:
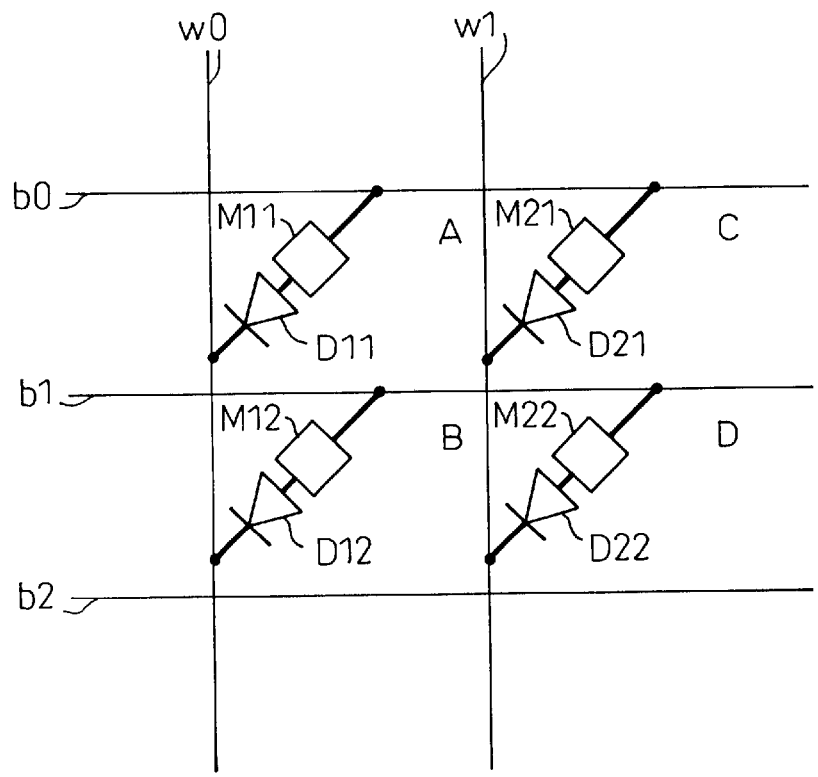
FIG. 10 is a simplified circuit diagram showing a relationship between a general magnetic memory cell and an isolating-diode.
Figure 11:
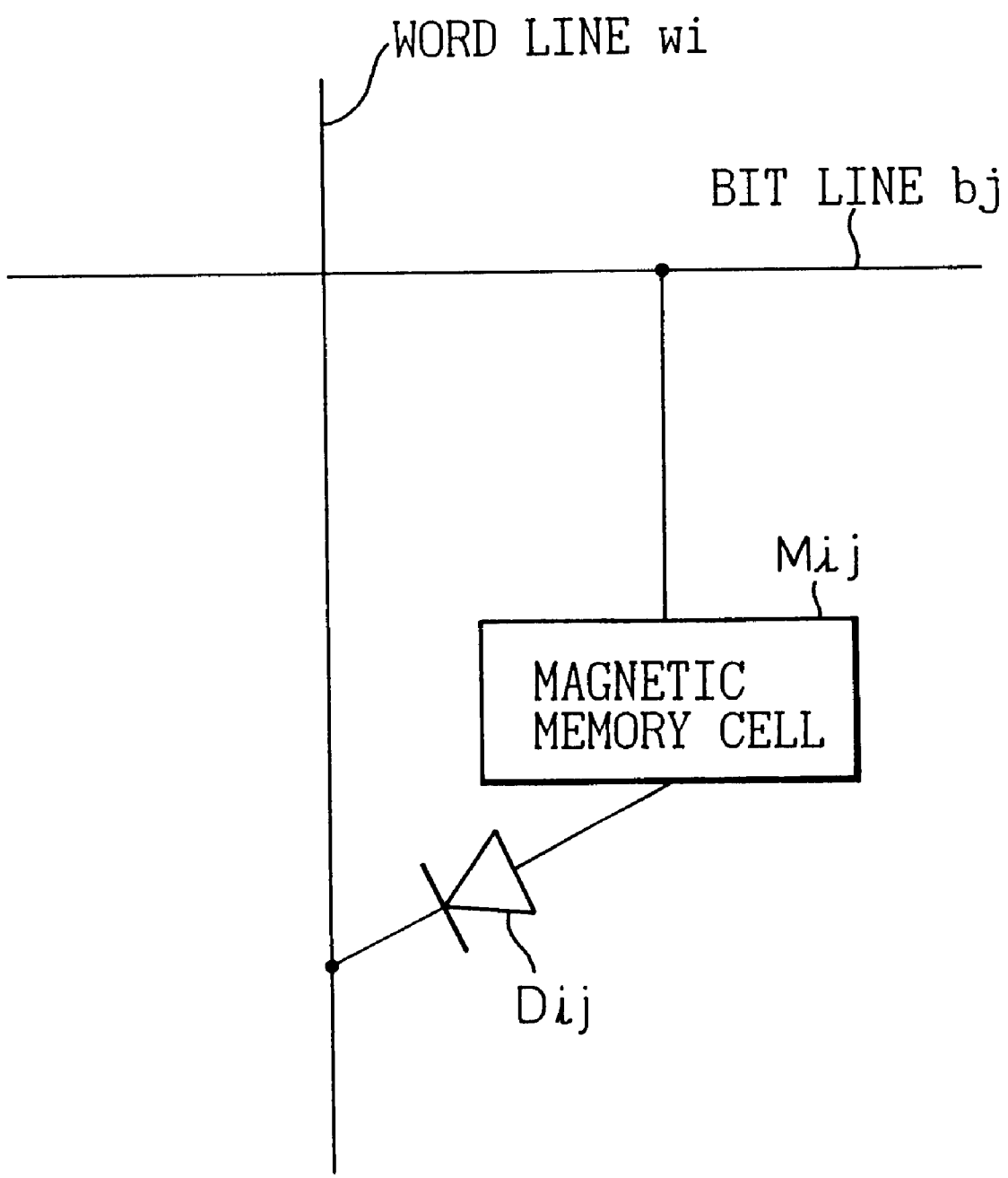
FIG. 11 is a simplified circuit diagram showing an enlarged view of each memory cell portion shown in FIG. 10.

FIG. 10 is a simplified circuit diagram showing a relationship between a general magnetic memory cell and an isolating-diode, and FIG. 11 is a simplified circuit diagram showing an enlarged view of each memory cell portion shown in FIG. 10.

In the general magnetic memory device as shown in FIG. 10, isolating-diodes (or isolating-transistors) D11 to D22 are provided in series with a plurality of magnetic memory cells M11 to M22, respectively, that are disposed in a matrix form. Each of four memory cell portions A, B, C and D includes a magnetic memory cell Mij disposed at a crossing between a word line wi (where, i is an optional positive integer of 0 or 1 or above) and a bit line bj (where, j is an optional positive integer of 0 or 1 or above),and an isolating-diode Dij that is connected in series with this magnetic memory cell Mij, as shown in FIG. 8.

Assume that there is no isolating-diode provided at all in the magnetic memory device shown in FIG. 10. For reading the data (information) of the memory cell portion A, a high-potential voltage is applied to the corresponding bit line b0, and a low-potential voltage is set to the corresponding word line w0, and then a current that flows through the magnetic memory cell M11 is detected. In this case, it is necessary to keep a high potential in all other word lines w1, - - -, and wm (where m is an optional positive integer of 2 or above). Otherwise, a current flows in other memory cell portions, for example, the memory cell portion C, that share the same bit line.

Therefore, in order to prevent this problem, it is necessary to set a high potential to the word line w1. In this case, the bit line b0 is also at a high potential. Therefore, a current flows in all other memory cells including the memory cell D that are connected to the word line w, although a current does not flow in the memory cell C.

In order to prevent this problem, it is necessary to apply a high-potential voltage to all other bit lines b1 to bn (where n is an optional positive integer of 2 or above). However, in this case, a current flows in the memory cell portion B, which raises the potential of the word line w0.

From the above viewpoint, it can be understood that it is sufficient to connect an isolating-diode in series with each magnetic memory cell, and to keep a high potential in all word lines of the non-selected magnetic memory cells. In this case, the potential of the word line does not affect the potential of the non-selected bit lines b1 to bn.

Figure 12:
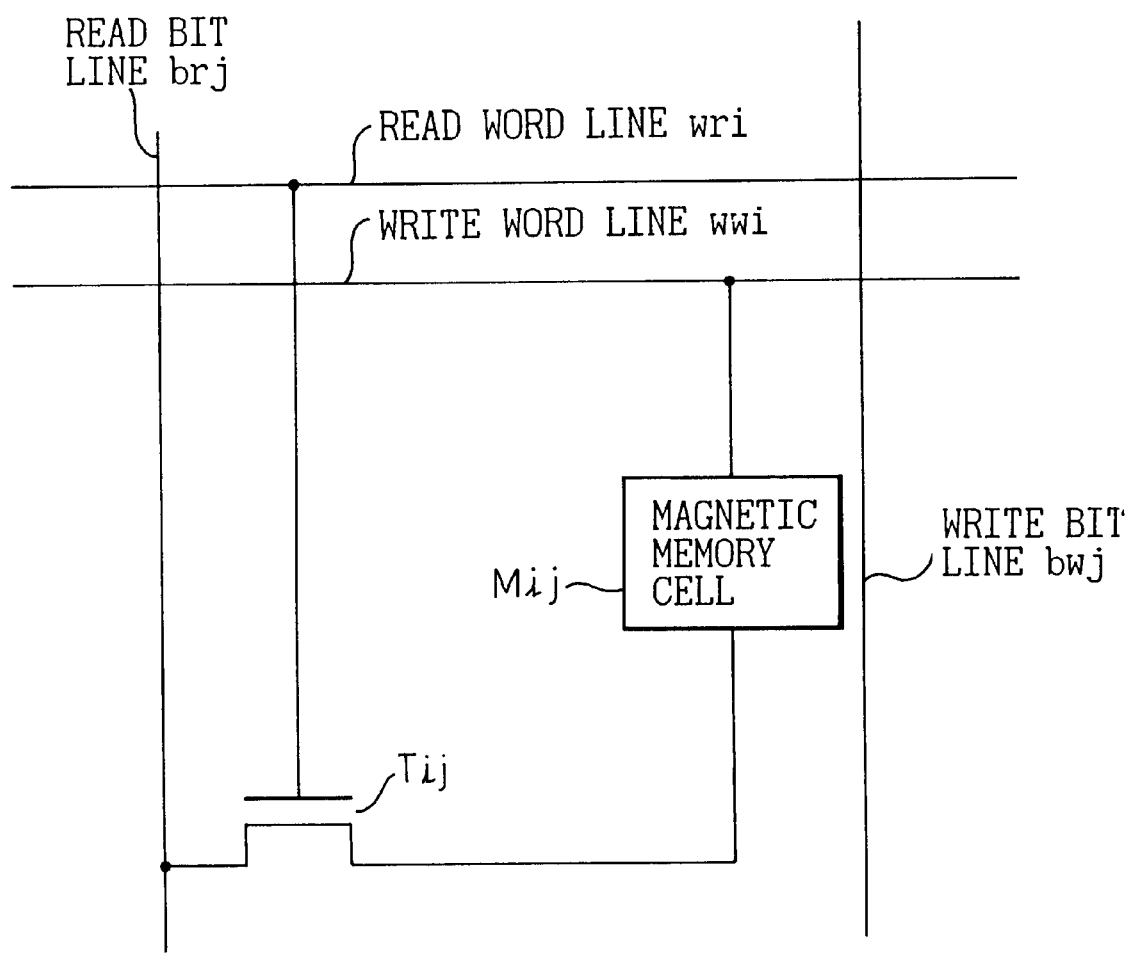
FIG. 12 is a simplified circuit diagram showing an enlarged view of each memory cell portion when a transistor is used in place of the isolating-diode shown in FIG. 11.

FIG. 12 is a simplified circuit diagram showing an enlarged view of each memory cell portion when a transistor is used in place of the isolating-diode shown in FIG. 11.

In a magnetic memory device as shown in FIG. 12, isolating-transistors Tij are provided in series with a plurality of magnetic memory cells Mij, respectively, that are disposed in a matrix form. In this case, FIG. 12 shows a magnetic memory device having a plurality of magnetic memory cells Mij disposed along crossings between a pair of word lines consisting of a write word line wwi and a read word line wri and a pair of bit lines consisting of a write bit line bwj and a read bit line brj.

In the magnetic memory device shown in FIG. 12, for writing data into a magnetic memory cell Mij, a write word line wwi and a write bit line bwj are selected simultaneously, and a predetermined potential is set to these lines. Further, a current flows through the magnetic memory cell Mij. In this way, a direction of the magnetic moment of the magnetic layer within the magnetic memory cell is controlled.

For reading data that is stored in a magnetic memory cell Mij, a high potential is set to a selected read word line wri, and a low potential is set to a selected read bit line brj. With this arrangement, the gate of the isolating-transistor Tij connected to the selected read word line wri becomes at a high potential, and this isolating-transistor Tij becomes in the ON state. In this case, as a low potential has been set to the selected read bit line brj, a current flows from the corresponding Mij. As a result, it becomes possible to decide whether the data stored in the magnetic memory cell Mij is the data "0" or "1".

In the meantime, a low potential is set to all the non-selected word lines, and a high potential is set to all the non-selected read bit lines. With this arrangement, the gates of the isolating-transistors Tij connected to the non-selected read word lines wri becomes at a low potential, and these isolating-transistors Tij become in the OFF state. Therefore, it becomes possible to prevent a current from flowing from the magnetic memory cells disposed corresponding to the non-selected read word lines. As a result, the isolating-transistor connected to the selected read word line becomes in the ON state regardless of the potential of the read bit line. However, as the high potential has been set to all the non-selected read bit lines, a current will not flow from the non-selected magnetic memory cells to the corresponding read bit lines.

From the above viewpoint, it can be understood that the isolating-transistor shown in FIG. 12 has a substantially similar function to that of the isolating-diode shown in FIG. 10 and FIG. 11. As explained above, in the general magnetic memory device, it is necessary to provide active elements, such as the isolating-diodes or isolating-transistors, in order to prevent a plurality of magnetic memory cells from being selected simultaneously.

In the above first embodiment, the resistances of the first magnetic layers at the lower-layer portions of three-layer magnetic memory cells disposed along a word line selected at the time of reading data are set to a low level. Further, the resistances of the first magnetic layers at the lower-layer portions of the three-layer magnetic memory cells disposed along a non-selected word line are set to a high level. With this arrangement, there is provided a function that is similar to that of the above-described isolating-diodes or isolating-transistors. As a result, the isolating-diodes or isolating-transistors are not necessary in the first embodiment.

Figure 13:
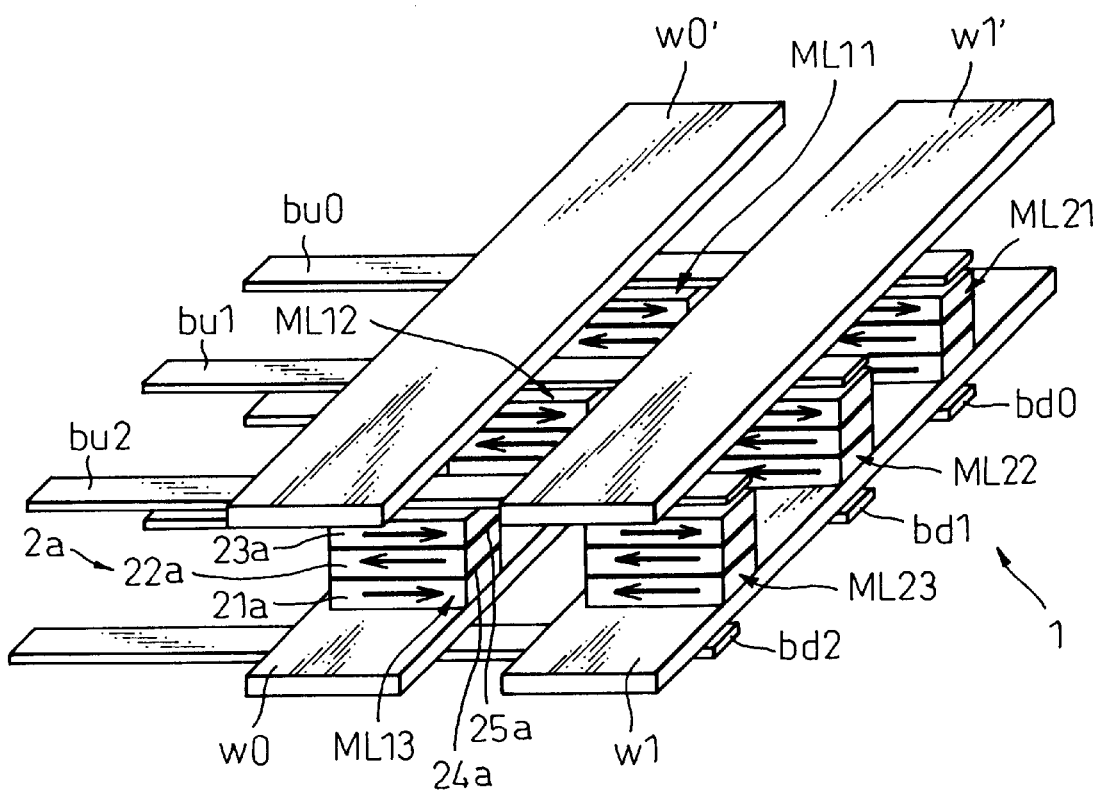
FIG. 13 is a perspective view showing a main part of a second preferred embodiment of the present invention.
Figure 14:
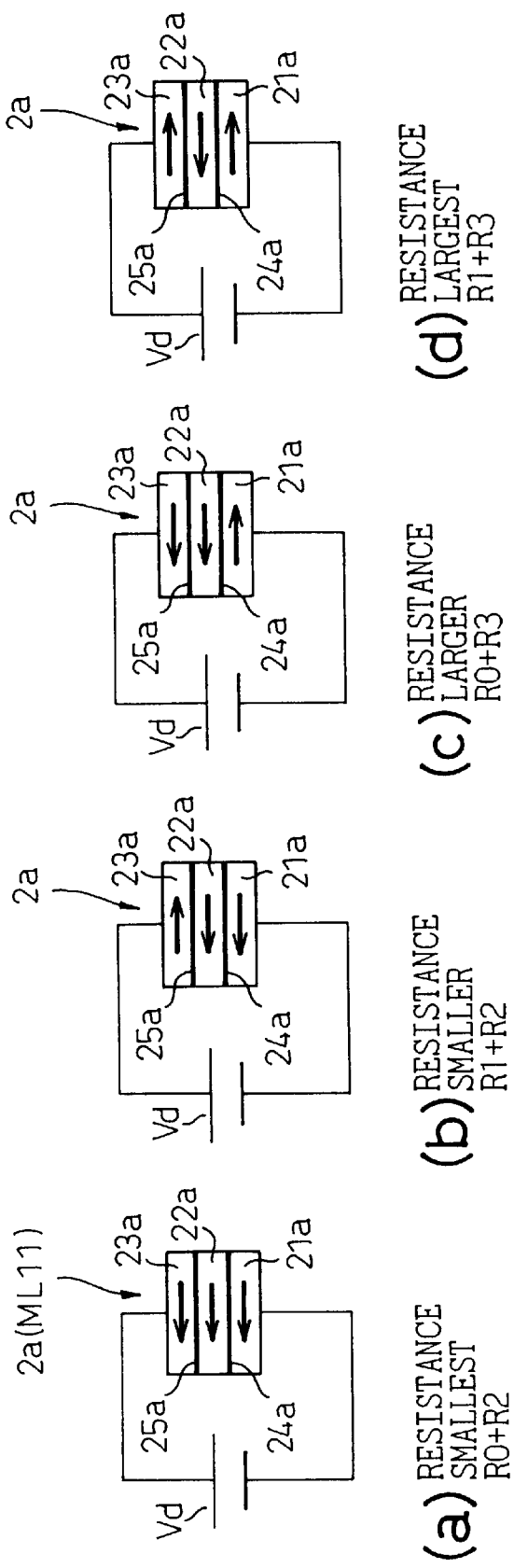
FIGS. 14a–d is a schematic diagram showing a relationship between a direction of a magnetic moment of a magnetic layer and a resistance shown in FIG. 13.

FIG. 13 is a perspective view showing a main part of a second preferred embodiment (hereinafter referred to as a second embodiment) of the present invention, and FIG. 14 is a schematic diagram showing a relationship between a direction of a magnetic moment of a magnetic layer and a resistance shown in FIG. 13. FIG. 13 shows a simplified structure of a main portion of a magnetic memory device relating to the second embodiment of the present invention. In this case, a tunneling-type ferromagnetic memory device is also used as a magnetic memory device 1.

A magnetic memory device 1 relating to the second embodiment shown in FIG. 14 includes a three-layer multi-bit type magnetic memory cell 2a having a laminated structure of a first magnetic layer 21a at a lower-layer portion, a second magnetic layer 22a at an intermediate-layer portion, and a third magnetic layer 23a at an upper-layer portion. A first non-magnetic layer 24a is formed between the first magnetic layer 21a and the second magnetic layer 22a within this magnetic memory cell, for electrically and magnetically isolating these magnetic layers. Further, a second non-magnetic layer 25a is formed between the second magnetic layer 22a and the third magnetic layer 23a. In other words, the magnetic memory device 21 of the second embodiment has a substantially similar structure to that of the magnetic memory device 1 of the first embodiment (FIG. 4).

In the second embodiment shown in FIG. 13, there are provided two kinds of word lines w0, w1, w0' and w1' consisting of a plurality of word lines (w0, w1) and a plurality of control word lines (w0',w1'). Also, there are provided two kinds of bit lines bd0, bd1, bd2, bu0, bu1, and bu2 consisting of a plurality of lower bit lines (bd0, bd1, and bd2) and a plurality of upper bit lines (bu0, bu1, and bu2). In this case, a plurality of magnetic memory cells 2a are prepared, each having the above-described structure. These magnetic memory cells 2a are disposed in a matrix form along crossings between the two kinds of word lines and the two kinds of bit lines that cross these word lines, respectively.

More specifically, the plurality of word lines w0 and w1 and the lower bit lines bd0, bd1, and bd2 that are adjacent to these word lines w0 and w1 are provided at the lower-layer portions of the magnetic memory cells. Further, the plurality of control word lines w0' and w1' and the upper bit lines bu0, bu1, and bu2 that are adjacent to these control word lines w0' and w1' are provided at the upper-layer portions of the magnetic memory cells. In other words, the second embodiment shown in FIG. 13 has a structure in which the bit lines (the lower bit lines) have been added to the lower-layer portions of the magnetic memory cells in the above-described first embodiment (FIG. 4). In this case, the multi-bit magnetic memory cells disposed corresponding to the crossings between the plurality of word lines w0 and the w1 and the lower bit lines bd0, bd1, and bd2 (that is, corresponding to the crossings between the plurality of control word lines w0' and w1' and the upper bit lines bu0, bu1, and bu2) are defined as ML11, ML12, ML13, ML21, ML22, and ML23, respectively. Further, in the magnetic memory device relating to the second embodiment of the present invention, first lines are structured by the plurality of word lines w0 and w1 and the control word lines w0' and w1'. Second lines of the magnetic memory device consist of the plurality of lower bit lines bd0, bd1, and bd2 and the upper bit lines bu0, bu1, and bu2.

Further, in the second embodiment shown in FIG. 13, a predetermined current flows through the word lines w0 and w1 respectively to generate a magnetic field. Thus, a direction of the magnetic moment of each first magnetic layer 21a formed at the lower-layer portion of the multi-bit magnetic memory cell, is controlled. In the meantime, a predetermined current flows through the control word lines w0' and w1' respectively to generate a magnetic field, thereby to control a direction of the magnetic moment of each third magnetic layer 23a formed at the upper-layer portion of the multi-bit magnetic memory cell. Further, the first magnetic layers 21a at the lower-layer portions are adjacent to both the word lines w0 and w1 and the lower bit lines bd0, bd1, and bd2. Therefore, it is possible to invert a direction of the magnetic moment of a specific first magnetic layer 21 located at a crossing between a selected word line and a selected lower bit line. In the meantime, the third magnetic layers 23a at the upper-layer portions are adjacent to both the control word lines w0' and w1' and the upper bit lines bu0, bu1, and bu2. Therefore, it is possible to invert a direction of the magnetic moment of a specific third magnetic layer 23 located at a crossing between a selected control word line and a selected upper bit line. In actual practice, the magnetic moment of the first magnetic layer 21a at the lower-layer portion and the magnetic moment of the third magnetic layer 23a at the upper-layer portion are controlled by a combined magnetic field of a word line and a bit line. Therefore, their magnetic moments face a slanted direction instead of a horizontal direction with respect to the magnetic layer.

Further, a magnetic moment of each second magnetic layer 22a formed at the intermediate-layer portion can be controlled to face a constant direction, by generating a ferromagnetic field based on a relatively large current, using one or both of the control word line at the upper-layer portion and the word line at the lower-layer portion. This control is carried out in a similar manner to that described in the first embodiment. Based on this arrangement, it is possible to independently invert the magnetic moment of the first magnetic layer 21a at the lower-layer portion and the magnetic moment of the third magnetic layer 23a at the upper-layer portion, respectively, without having influence on the magnetic moment of the second magnetic layer 22a at the intermediate-layer portion. Therefore, according to the second embodiment, it becomes possible to store multi-value data of at least two bits (multi-bit data).

As shown in portions (a) to (d) of FIG. 14, according to the directions of the magnetic moments of the first, second and third magnetic layers formed on each of the multi-bit magnetic memory cells ML11, ML12, ML13, ML21, ML22, and ML23, respectively, each portion has the following resistance. That is, the portion including the third magnetic layer 23a at the upper-layer portion has a two-value resistance of R0 and R1 (R0<R1), and the portion including the first magnetic layer 21a at the lower-layer portion has a two-valve resistance of R2 and R3 (R2<R3). As explained above, the direction of the magnetic moment of the third magnetic layer 23a at the upper-layer portion is controlled by using the control word lines w0' and w1' and the upper bit lines bu0, bu1, and bu2. On the other hand, the direction of the magnetic moment of the first magnetic layer 21a at the lower-layer portion is controlled by using the word lines w0 and w1 and the lower bit lines bd0, bd1, and bd2. In short, the upper-layer portion and the lower-layer portion of the multi-bit magnetic memory cell can store the data "0" or "1" mutually independently.

Referring to portions (a) to (d) of FIG. 14, when the magnetic moments of the second magnetic layer 22a and the third magnetic layer 23a are mutually in parallel directions, the resistance of the portion including this third magnetic layer 23a becomes R0. This occurs in a similar manner to that explained with reference to FIG. 3. Also, when the magnetic moments of the second magnetic layer 22a and the third magnetic layer 23a are mutually in anti-parallel directions, the resistance of the portion including this third magnetic layer 23a becomes R1. The resistance R0 is smaller than the resistance R1 (R0<R1) as explained above. On the other hand, when the magnetic moments of the first magnetic layer 21a and the second magnetic layer 22a are mutually in parallel directions, the resistance of the portion including this first magnetic layer 21a becomes R2. When the magnetic moments of the first magnetic layer 21a and the second magnetic layer 22a are mutually in anti-parallel directions, the resistance of the portion including this first magnetic layer 21a becomes R3. The resistance R2 is smaller than the resistance R3 (R2<R3) as explained above. Therefore, when a current has been passed in a direction vertical to the first to third magnetic layers 21a and 23a, the resistances become R0+R2, R1+R2, R0+R3, and R1+R3 based on the directions of the magnetic moments of the first to third magnetic layers 21a to 23a, as shown in portions (a) to (d) of FIG. 14. The relationship of the values of these resistances is set as follows, in a similar manner to that of the above-described first embodiment (FIG. 3): (R0+R2)<(R1+R2)<(R0+R3)<(R1+R3).

As explained above, the resistances R0 and R1 are determined by the direction of the magnetic moment of the third magnetic layer 23a of the magnetic memory cell that is located at a crossing between the selected control word line and the selected upper bit line. Therefore, it is possible to make the resistance R0 and R1 correspond to the data "0" and "1" at the lower-layer portion of the magnetic memory cell, respectively, as shown in portion (a) and portion (b) of FIG. 14. Further, the resistances R2 and R3 are determined by the direction of the magnetic moment of the first magnetic layer 21a of the magnetic memory cell that is located at a crossing between the selected word line and the selected lower bit line.

Therefore, it is possible to make the resistances R2 and R3 correspond to the data "0" or "1" at the lower-layer portion of the magnetic memory cell, respectively, as shown in portion (c) and portion (d) of FIG. 14. In other words, in portion (a) of FIG. 14, the data at the upper-layer portion and the lower-layer portion both become "0" ("00"). In portion (b) of FIG. 14, the data at the upper-layer portion becomes "0", and the data at the lower-layer portion becomes "1" ("01"). Further, in portion (c) of FIG. 14, the data at the upper-layer portion becomes "1", and the data at the lower-layer portion becomes "0" ("10"). In portion (d) of FIG. 14, the data at the upper-layer portion and the lower-layer portion both become "1" ("11"). These four-value data can be corresponded to theoretical values. Therefore, it is possible to apply the above second embodiment to a multi-functional magnetic memory device.

It should be noted that, in the second embodiment, the function of the isolating-diodes or isolating-transistors for isolating the plurality of magnetic memory cells from each other cannot be provided to the non-magnetic layers at the lower-layer portions of the magnetic memory cells, unlike the above-described first embodiment. Therefore, in the second embodiment, it is necessary to provide an isolating-diode or an isolating-transistor in series with each magnetic memory cell. When isolating-diodes for isolating the plurality of multi-bit magnetic memory cells from each other are provided in series with the plurality of multi-bit magnetic memory cells ML11 to ML23, respectively, shown in FIG. 14, it becomes possible to individually control the data at the upper-layer portion and the lower-layer portion of each multi-bit magnetic memory cell. Based on this arrangement, it is possible to carry out an independent control of four values with one memory cell. As a result, it is possible to achieve a multi-bit MRAM.

Figure 15:
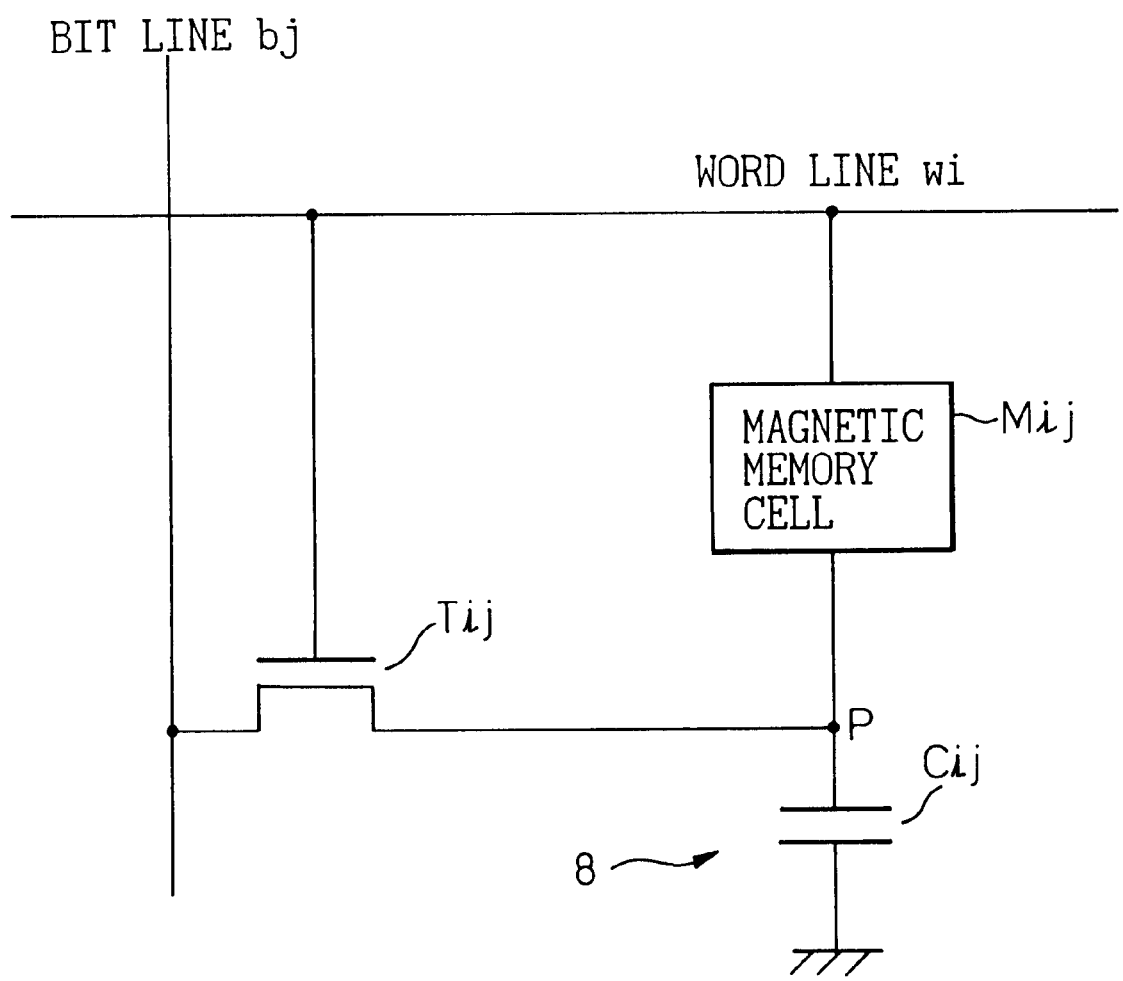
FIG. 15 is a simplified circuit diagram showing a main part of a third preferred embodiment of the present invention.
Figure 16:
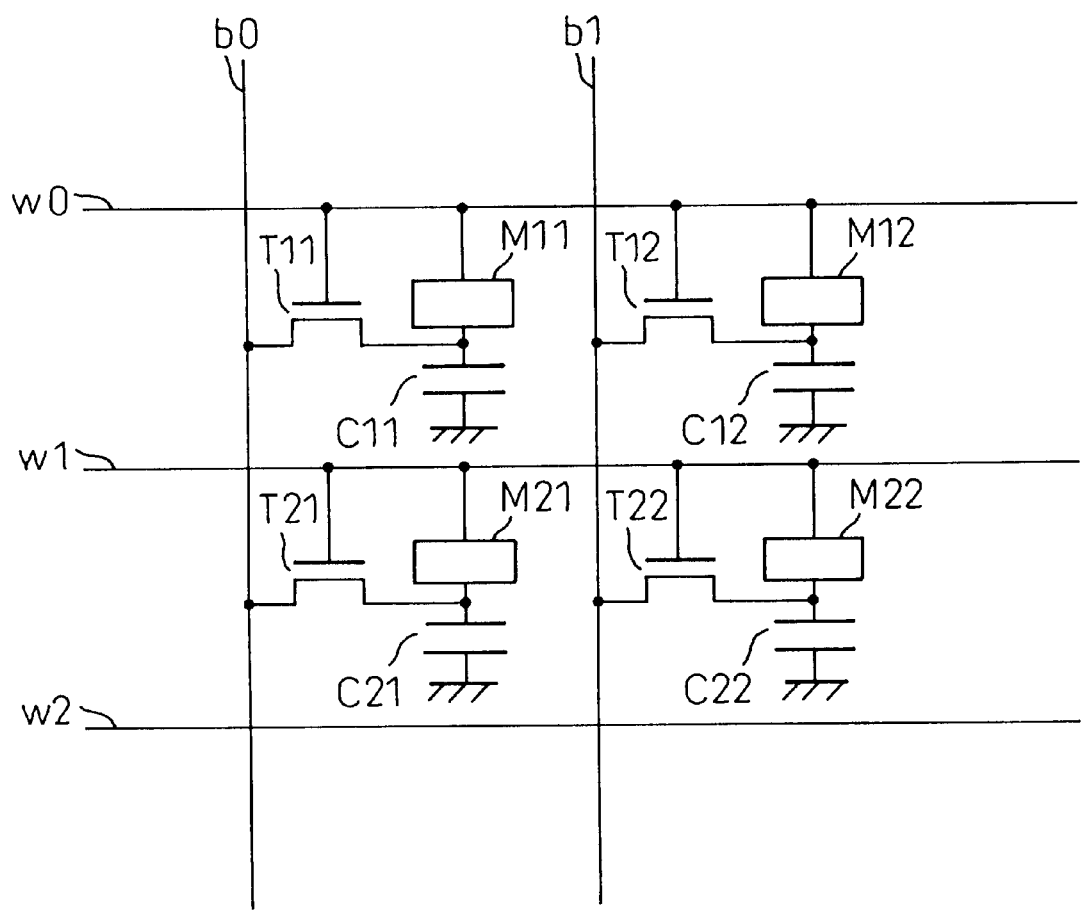
FIG. 16 is a simplified circuit diagram showing a total structure of a magnetic memory cell relating to the embodiment shown in FIG. 15.
Figure 17:
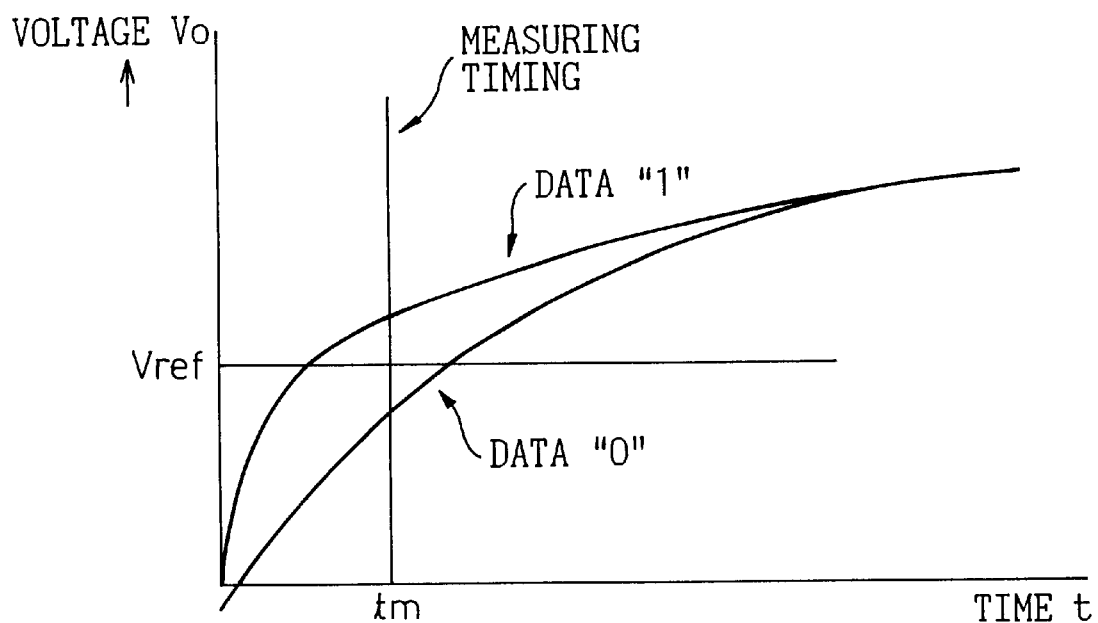
FIG. 17 is a graph showing a time change in the voltage at one end of a capacitor in the embodiment shown in FIG. 15.

FIG. 15 is a simplified circuit diagram showing a main part of a third preferred embodiment (hereinafter referred to as a third embodiment) of the present invention. FIG. 16 is a simplified circuit diagram showing a total structure of a magnetic memory cell relating to the embodiment shown in FIG. 15. FIG. 17 is a graph showing a time change in the voltage at one end of a capacitor in the embodiment shown in FIG. 15. It is assumed that a magnetic memory cell has a structure of having two or more non-magnetic layers laminated together (that is, including a conventional magnetic memory cell).

In the magnetic memory device shown in FIG. 15, isolating-transistors Tij are provided in series with a plurality of magnetic memory cells Mij, respectively, that are disposed in a matrix form. FIG. 15 exemplifies a magnetic memory device having a structure in which a magnetic memory cell Mij is disposed at a crossing between one word line wi and one bit line bj.

In the total structure of a magnetic memory device shown in FIG. 16, a plurality of magnetic memory cells (M11 to M23) are prepared. The plurality of magnetic memory cells are disposed in a matrix form along crossings between a plurality of word lines (only w0, w1 and w2 are shown here) and a plurality of bit lines (only b0 and b1 are shown here) that cross these word lines. Further, isolating-transistors T11 to T22 for isolating these magnetic memory cells from each other are provided in series with the plurality of magnetic memory cells M11 to M22, respectively.

In the magnetic memory device having the above-described structure, for writing data to a magnetic memory cell Mij, a word line wi and a bit line bj are selected simultaneously, and a predetermined potential is set to these lines. Then, a current is passed through the magnetic memory cell Mij, thereby to control a direction of the magnetic moment of the magnetic layer within the magnetic memory cell.

For reading data stored in a magnetic memory cell Mij, a high potential is set to a selected word line wi, and a low potential is set to a selected bit line bj. With this arrangement, the gate of an isolating-transistor Tij connected to the selected word line wi becomes at a high potential, and this isolating-transistor Tij becomes in the ON state. In this case, as the selected read bit line bj has been set to a low potential, a current flows from the corresponding Mij. This current is detected by a sense amplifier or the like, and is compared with a reference current. Thus, it is possible to decide whether the data stored in the magnetic memory cell Mij is "0" or "1". As explained with reference to FIG. 12, it is possible to prevent a current from flowing from non-selected magnetic memory cells, based on the function of the isolating-transistor Tij.

As explained above, according to the general magnetic memory device, a data write operation or a data read operation is carried out by simultaneously passing a current through each of the selected word line and the selected bit line. Therefore, there arises such an inconvenience that the total power consumption of the magnetic memory device becomes relatively large.

In order to cope with this inconvenience, according to the above third embodiment, voltage reading means (or a voltage reading unit) 8 such as a capacitor Cij having substantially the same capacity as the capacity of each magnetic memory cell is connected in series with each magnetic memory cell. It is assumed, however that, the capacity of the capacitor Cij has a permissible range of identifiable variations. Preferably, each of the plurality of magnetic memory cells M11 to M12 is provided between one terminal and on search terminal.

In the third embodiment, in place of making a decision on the data "0" or "1" by detecting a current that flows out from the selected magnetic memory cell, a decision is made as follows. That is, a decision is made on a voltage level obtained by measuring at a predetermined timing a potential of a connection point P between one terminal of each magnetic memory cell Mij and the capacitor Cij.

In explaining in further detail, a predetermined voltage (for example, a high-potential voltage) is applied to a word line wi that is selected for reading the data, and electric charges are injected into the capacitor Cij that has been connected in series with the magnetic memory cell Mij. A resistance is different depending on whether the data stored in the magnetic memory cell Mij is "0" or "1". Therefore, by utilizing a difference in the charge characteristics (a charging curve) of the capacitor Cij, this difference in the charge characteristics is detected as a voltage level, thereby to decide on the data "0" or "1".

More specifically, as shown in the graph of FIG. 17, a change in a voltage v0 at one terminal (the connection point P) of the capacitor Cij is measured, using a time t when the capacitor Cij is charged as a parameter. Further, a voltage level obtained by a voltage conversion is detected at a predetermined measuring timing tm. This voltage level is compared with a reference voltage Vr, thereby to decide on the data "0" or "1". FIG. 17 exemplifies a charging curve for the case in which the resistance of a magnetic memory cell that stores the data "0" is larger than the resistance of a magnetic memory cell that stores the data "1". In this case, when the voltage level detected at the measuring timing tm is higher than the reference voltage Vr, the data "1" is read out, and when the voltage level detected at the measuring timing tm is lower than the reference voltage Vr, the data "0" is read out.

According to the above third embodiment, in place of detecting a current that flows through the magnetic memory cell, a difference is detected in the voltage levels of the charging curves based on an electric charge injected to the capacitor connected in series with the magnetic memory cell. The data "0" or "1" is decided based on this voltage level. Therefore, it is possible to substantially reduce the total power consumption of the magnetic memory device.

Preferably, for carrying out a data read operation by detecting a difference in the resistance of a magnetic memory cell selected by a word line and a bit line in the magnetic memory device having the structure shown in FIG. 15 and FIG. 16, a capacitor having a capacity substantially equal to the capacity of each magnetic memory cell is connected in series with each magnetic memory cell. Then, a potential at a connection point between one terminal of the magnetic memory cell selected by the word line and the bit line and the capacitor is measured at a predetermined timing, thereby to decide on this voltage level.

Figure 18:
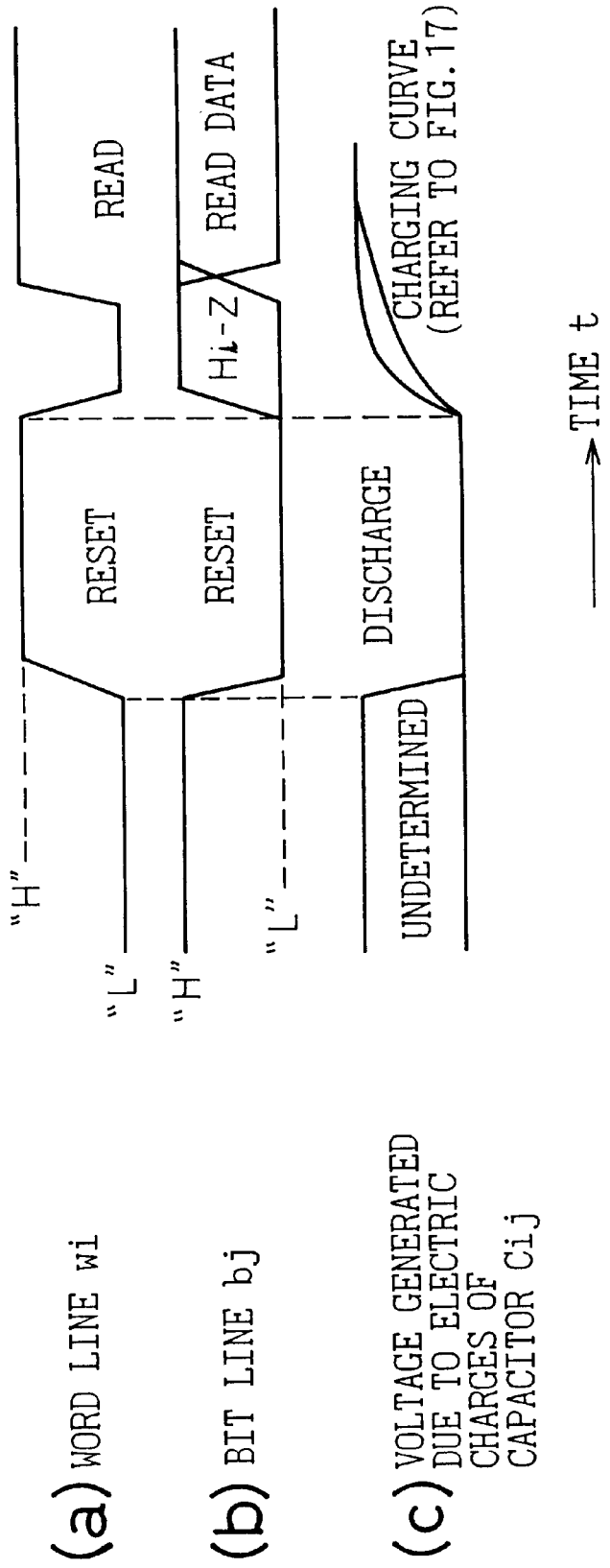
FIGS. 18a–c is a timing chart showing a first example of discharging electric charges of the capacitor before the read operation in the embodiment shown in FIG. 15.

FIG. 18 is a timing chart showing a first example of discharging electric charges of the capacitor before the read operation in the embodiment shown in FIG. 15.

As is obvious from the charging curve shown in FIG. 17, in order to accurately detect the voltage v0 at a predetermined measuring timing, it is necessary to discharge the electric charges of the capacitor Cij before executing the data read operation. Thus, the voltage v0 level is set to be zero at the timing of starting the charging of the capacitor.

As shown in the timing chart of FIG. 18, the first example of discharging the electric charges of the capacitor Cij is for discharging the electric charges accumulated in the capacitor Cij toward the bit line bj before executing the data read operation.

In the above first example, prior to the reading of the data stored in the magnetic memory cell selected by the word line and the bit line, a high potential ("H") is set to the word line wi connected to the terminal opposite to the connection point P of the magnetic memory cell. A low potential ("L") is set to the bit line bj connected to the other terminal of the magnetic memory cell via the isolating-transistor Tij. As a result, the gate of the isolating-transistor Tij becomes at a high potential, and this isolating-transistor Tij becomes in the ON state. Based on this arrangement, the electric charges accumulated in the capacitor Cij connected to one terminal of the magnetic memory cell are discharged toward the bit line bj, and this magnetic memory cell is reset.

Then, the capacitor Cij changes from an undetermined state to a reset state. However, in this case, a current does not flow that is large enough to invert a direction of the magnetic moment of the magnetic layer within the magnetic memory cell. Thereafter, a difference in charging curves when an electric charge has been charged to the capacitor Cij is detected as a voltage level. While the capacitor Cij is being charged, the bit line bj is in the high impedance state (a Hi-Z state), during which a data read operation is prohibited.

Further, in the first example, it is preferable that a high potential is set to the word line connected to the other terminal of each of the plurality of non-selected magnetic memory cells, and that a low potential is set to the bit line. Thus, the electric charges accumulated in the capacitor connected in series with each non-selected magnetic memory cell are discharged toward the bit line. With this arrangement, the electric charges of the capacitor connected in series with each non-selected magnetic memory cell are all discharged, and these electric charges do not have influence on the operation of reading data from the selected magnetic memory cell.

Figure 19:
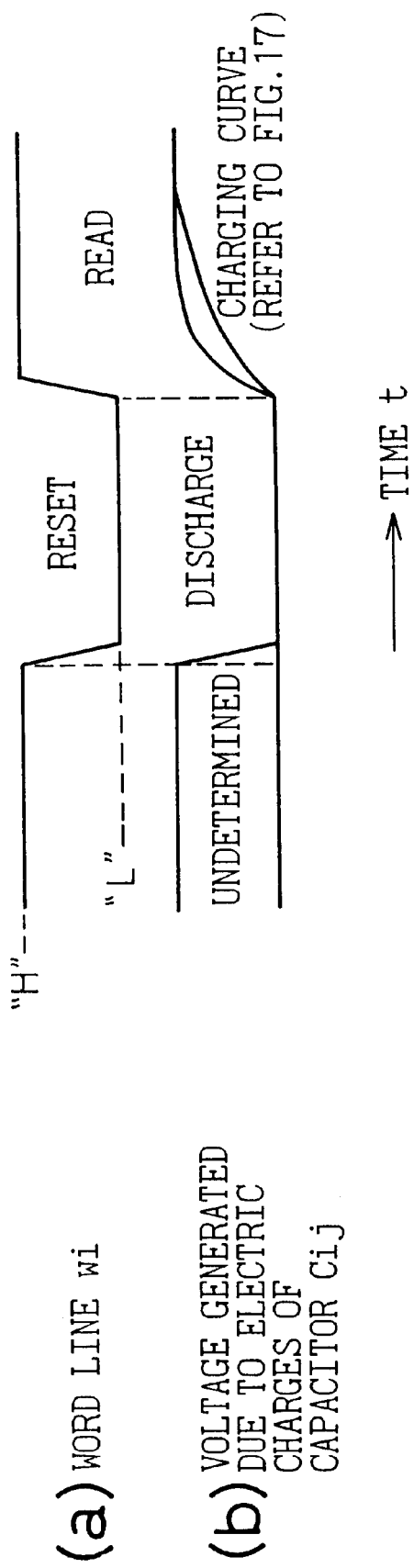
FIGS. 19a–b is a timing chart showing a second example of discharging electric charges of the capacitor before the read operation in the embodiment shown in FIG. 15.

FIG. 19 is a timing chart showing a second example of discharging electric charges of the capacitor before the read operation in the embodiment shown in FIG. 15.

In the above second example, prior to the reading of the data stored in the magnetic memory cell selected by the word line and the bit line, the word line wi connected to the terminal opposite to the connection point P of the magnetic memory cell is connected to a low-potential ("L") power source line. In this case, the electric charges accumulated in the capacitor Cij connected to one terminal of the magnetic memory cell are discharged toward the word line wi via the magnetic memory cell, and this magnetic memory cell is reset. Then, the capacitor Cij changes from an undetermined state to a reset state. In other words, the operation similar to the operation of writing the data "0" to the magnetic memory cell is carried out. However, in this case, a current does not flow that is large enough to invert a direction of the magnetic moment of the magnetic layer within the magnetic memory cell. Thereafter, a difference in charging curves when an electric charge has been charged to the capacitor Cij is detected as a voltage level.

Further, in the second example, it is preferable that the word line connected to the other terminal of each of the plurality of non-selected magnetic memory cells is connected to a low-potential power source line. Thus, the electric charges accumulated in the capacitor connected in series with each non-selected magnetic memory cell are discharged toward the word line. With this arrangement, the electric charges of the capacitor connected in series with each non-selected magnetic memory cell are all discharged, and these electric charges do not have influence on the operation of reading data from the selected magnetic memory cell.

Figure 20:
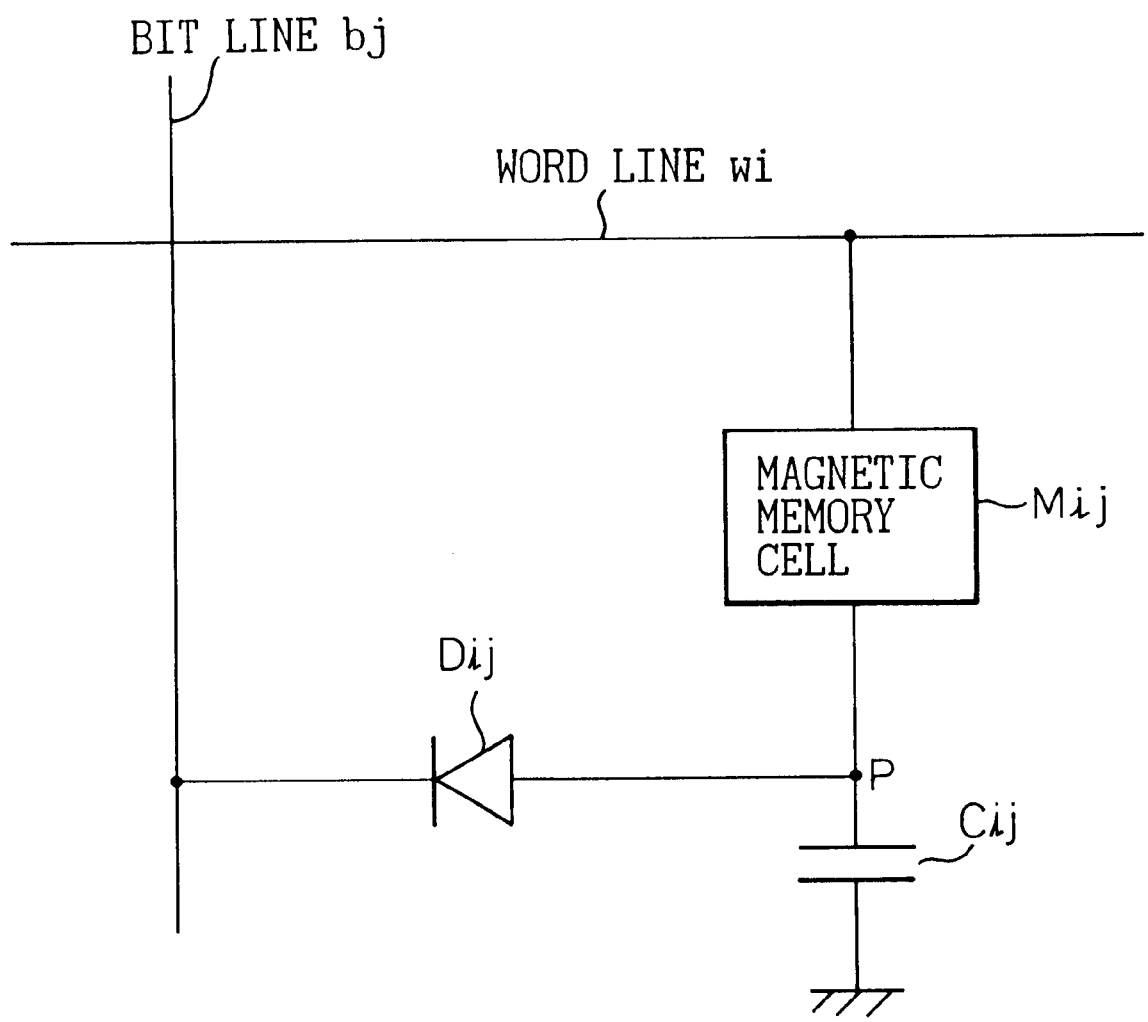
FIG. 20 is a simplified circuit diagram showing a structure of a modified example of FIG. 15.
Figure 21:
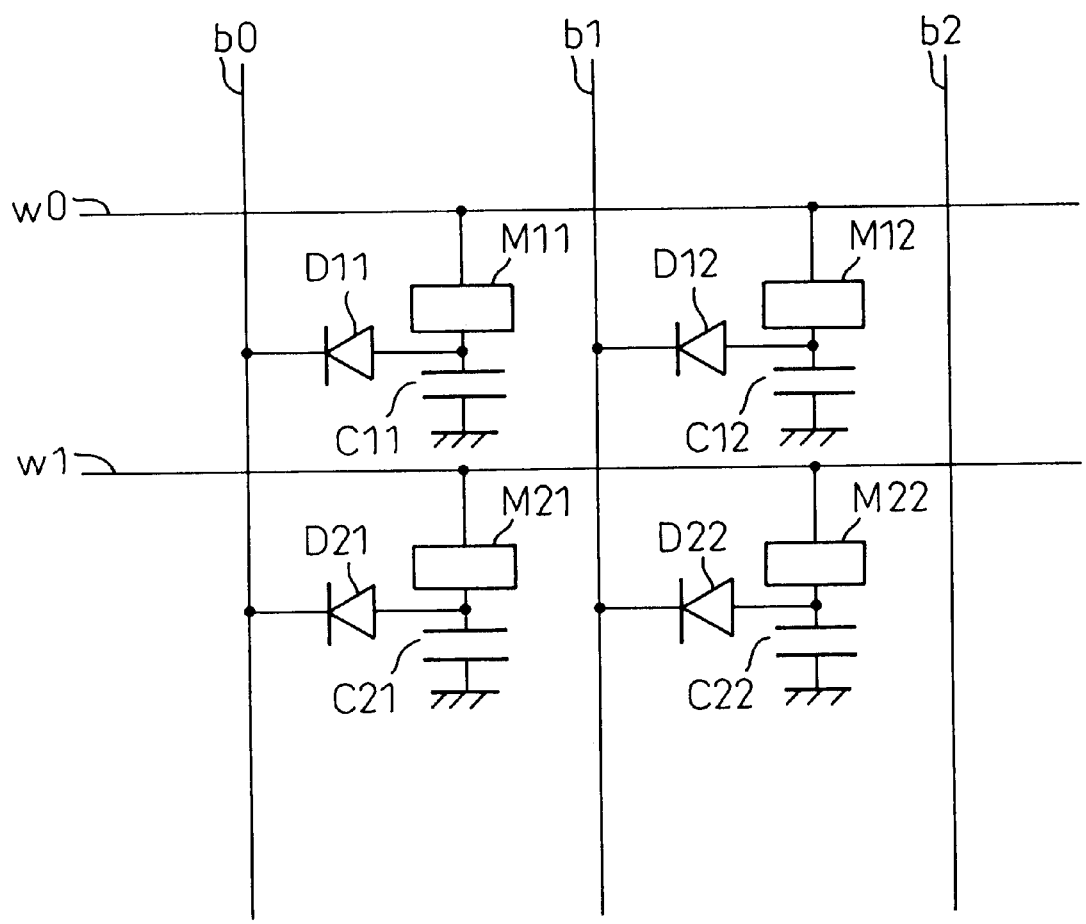
FIG. 21 is a simplified circuit diagram showing a total structure of a magnetic memory cell shown in FIG. 20.

FIG. 20 is a simplified circuit diagram showing a structure of a modified example of FIG. 15, and FIG. 21 is a simplified circuit diagram showing a total structure of the magnetic memory cell shown in FIG. 20.

In the magnetic memory cell shown in FIG. 20 and FIG. 21, isolating-diodes Dij (D11 to D22) are provided in place of the isolating-transistors Tij of the third embodiment shown in FIG. 15 and FIG. 16. More specifically, in FIG. 20 and FIG. 21, the isolating-diodes Dij (D11 to D22) for isolating a plurality of magnetic memory cells from each other are connected in series with magnetic memory cells Mij (M11 to M12), respectively, that are disposed in a matrix form.

As explained with reference to FIG. 10 and FIG. 11, it is possible to prevent a current from flowing from non-selected magnetic memory cells, based on the function of the isolating-diodes Dij. However, it should be noted that, in the magnetic memory device shown in FIG. 20 and FIG. 21, the connection relationship between the isolating-diode, the word line and the bit line is different from that shown in FIG. 10 and FIG. 11. In this modified example, a high potential is set to only a selected word line, and a low potential is set to only a selected bit line, thereby to prevent a current from flowing from non-selected magnetic memory cells.

Constituent elements other than the above isolating-diodes Dij (particularly, the capacitors Cij) are the same as those of the third embodiment. Therefore, the detailed structure and the operation of the magnetic memory device having the capacitors Cij provided in series with the magnetic memory cells Mij will be not be explained here.

According to the above modified example, as in the third embodiment, a difference in the voltage levels of the charging curves is detected based on an electric charge injected to the capacitor connected in series with the magnetic memory cell, in place of detecting a current that flows through the magnetic memory cell. The data "0" or "1" is decided based on this voltage level. Therefore, it is possible to substantially reduce the total power consumption of the magnetic memory device.

As explained above, according to level preferred embodiments of the present invention, in magnetic memory cells, each having at least three-layer magnetic layers laminated together, a direction of any one magnetic moment of the at least three-layer magnetic layer is controlled by using at least two word lines and the like in each magnetic memory cell. With this arrangement, two-value or more data is stored in a specific magnetic memory cell. Therefore, it is possible to achieve magnetic memory cells having higher recording density than the conventional magnetic memory cells, and multi-functional magnetic memory cells.

Further, according to several preferred embodiments of the present invention, capacitors and the like are connected in series with magnetic memory cells, each having a plurality of magnetic layers laminated together. Further, a voltage level obtained by charging a capacitor of a magnetic memory cell is decided for reading data stored in this magnetic memory cell. Therefore, it is possible to reduce power consumption, as compared with the case in which a current flowing through a magnetic memory cell is detected.

What is claimed is:

1. A magnetic memory device comprising a plurality of magnetic memory cells, each magnetic memory cell being formed to have at least three magnetic layers including a first magnetic layer, a second magnetic layer and a third magnetic layer laminated together, and each magnetic memory cell having a resistance that is different depending on directions of magnetic moments of the first, second and third magnetic layers, respectively, wherein said plurality of magnetic memory cells are laid out along crossings between a plurality of first lines and a plurality of second lines that cross said first lines, respectively, and the magnetic memory device selectively passes a predetermined current through said first lines and said second lines, and controls directions of magnetic moments of the first, second and third magnetic layers, thereby to write data into a specific magnetic memory cell, wherein each of said first lines comprises at least two word lines, and each of said word lines individually controls a direction of a magnetic moment of any one of the first, second and third magnetic layers, thereby to store data of two or more values in the specific magnetic layer.

2. The magnetic memory device according to claim 1, wherein each of said first lines comprises two word lines, the two word lines being provided at an upper-layer portion and a lower-layer portion of each of said magnetic memory cell, respectively, and the word line in the upper-layer portion controls a direction of a magnetic moment of a magnetic layer formed on the upper-layer portion, and the word line in the lower-layer portion controls a direction of a magnetic moment of a magnetic layer formed on the lower-layer portion.

3. The magnetic memory device according to claim 2, wherein isolating-diodes or isolating-transistors for isolating a plurality of said magnetic memory cells from each other are provided in series with said magnetic memory cells, respectively, in order to prevent a plurality of said magnetic memory cells from being selected simultaneously at the time of reading data from any one of said magnetic memory cells selected by any one of said first lines and any one of said second lines by detecting a difference in the resistance of this magnetic memory cell.

4. The magnetic memory device according to claim 2, wherein at the time of reading data from any one of said magnetic memory cells selected by any one of said first lines and any one of said second lines by detecting a difference in the resistance of this magnetic memory cell, the magnetic memory device controls a direction of a magnetic moment of a magnetic layer of each magnetic memory cell in which there is disposed one word line located at a side not having influence on a current flowing through said second lines, out of the two word lines that constitute said first lines, for each of this word line, and makes the direction of the magnetic moment of this magnetic layer correspond to a selection or non-selection of the magnetic memory cell by said first line, thereby making it unnecessary to provide isolating-diodes or isolating-transistors for isolating a plurality of said magnetic memory cells from each other.

5. The magnetic memory device according to claim 2, wherein each of said second lines comprises two bit lines, the two bit lines being provided at an upper-layer portion and a lower-layer portion of each of said magnetic memory cells, respectively, and the word line in said upper-layer portion and the bit line in said upper-layer portion control a direction of a magnetic moment of a magnetic layer formed on said upper-layer portion, and the word line in said lower-layer portion and the bit line in said lower-layer portion control a direction of a magnetic moment of a magnetic layer formed on said lower-layer portion, thereby to store multi-value data.

6. The magnetic memory device according to claim 1, wherein isolating-diodes or isolating-transistors for isolating a plurality of said magnetic memory cells from each other are provided in series with said magnetic memory cells, respectively, in order to prevent a plurality of said magnetic memory cells from being selected simultaneously at the time of reading data from any one of said magnetic memory cells selected by any one of said first lines and any one of said second lines by detecting a difference in the resistance of this magnetic memory cell.

7. In a magnetic memory device comprising a plurality of magnetic memory cells, each magnetic memory cell being formed to have at least three magnetic layers including a first magnetic layer, a second magnetic layer and a third magnetic layer laminated together, and each magnetic memory cell having a resistance that is different depending on directions of magnetic moments of the first, second and third magnetic layers, respectively, wherein the plurality of magnetic memory cells are laid out along crossings between a plurality of first lines and a plurality of second lines that cross said first lines, respectively, a method of carrying out a data read operation by detecting a difference in the resistance of a magnetic memory cell selected by one of said first lines and one of said second lines in said magnetic memory device, wherein said magnetic memory device controls a direction of a magnetic moment of a magnetic layer of each magnetic memory cell in which there is disposed one word line located at a side not having influence on a current flowing through said second lines, out of the two word lines that constitute said first lines, for each of this word line, and said magnetic memory device makes the direction of the magnetic moment of this magnetic layer correspond to a selection or non-selection of the magnetic memory cell by said first line, thereby making it unnecessary to provide isolating-diodes or isolating-transistors for isolating a plurality of said magnetic memory cells from each other.

8. A magnetic memory device comprising a plurality of magnetic memory cells, each magnetic memory cell being formed to have a plurality of magnetic layers laminated together, and each magnetic memory cell having a resistance that is different depending on directions of magnetic moments of said plurality of magnetic layers, wherein said plurality of magnetic memory cells are laid out along crossings between a plurality of first lines and a plurality of second lines that cross said first lines, respectively, wherein said magnetic memory device has a voltage reading unit of capacity substantially equal to the capacity of each magnetic memory cell connected in series with each of said magnetic memory cells, and said magnetic memory device measures a potential at a connection point between one terminal of a magnetic memory cell selected by one of said first lines and one of said second lines and said voltage reading unit at a predetermined timing, and decides a voltage level of this potential, thereby to read data of this magnetic memory cell.

9. The magnetic memory device according to claim 8, wherein isolating-diodes or isolating-transistors for isolating a plurality of said magnetic memory cells from each other are provided, each between a connection point between one end of each of said magnetic memory cells and said voltage reading unit and said second line, in order to prevent a plurality of said magnetic memory cells from being selected simultaneously at the time of reading data from any one of said magnetic memory cells selected by any one of said first lines and any one of said second lines.

10. The magnetic memory device according to claim 9, wherein prior to the reading of data from any one of said magnetic memory cells selected by any one of said first lines and any one of said second lines, a high potential is set to the first line connected to the other end of the magnetic memory cell, and a low potential is set to said second line connected to one end of the magnetic memory cell via said isolating-diode or said isolating-transistor, thereby to discharge electric charges accumulated in said voltage reading unit connected to one end of the magnetic memory cell, toward said second line.

11. The magnetic memory device according to claim 10, wherein a high potential is set to the first line connected to the other end of each magnetic memory cell not selected by any one of said first lines and any one of said second lines, and a low potential is set to the second line connected to one end of said non-selected magnetic memory cell via said isolating-diode or said isolating-transistor, thereby the discharge electric charges accumulated in said voltage reading unit connected to one end of said non-selected magnetic memory cell, toward said second line.

12. The magnetic memory device according to claim 9, wherein prior to the reading of data from any one of said magnetic memory cells selected by any one of said first lines and any one of said second lines, the first line connected to the other end of the magnetic memory cell is connected to a power source line, and electric charges accumulated in said voltage reading means connected to one end of the magnetic memory cell are discharged toward said first line via the magnetic memory cell.

13. The magnetic memory device according to claim 12, wherein the first line connected to the other end of each magnetic memory cell not selected by any one of said first lines and any one of said second lines is connected to a power source line, and electric charges accumulated in said voltages reading unit connected to one end of said non-selected magnetic memory cell are discharged toward said first line via said non-selected magnetic memory cell.

14. In a magnetic memory device comprising a plurality of magnetic memory cells, each magnetic memory cell being formed to have a plurality of magnetic layers laminated together, and each magnetic memory cell having a resistance that is different depending on directions of magnetic moments of said plurality of magnetic layers, wherein said plurality of magnetic memory cells are laid out along crossings between a plurality of first lines and a plurality of second lines that cross said first lines, respectively, a method of carrying out a data read operation by detecting a difference in the resistance of a magnetic memory cell selected by one of said first lines and one of said second lines in said magnetic memory device, wherein said magnetic memory device has voltage reading unit of capacity substantially equal to the capacity of each magnetic memory cell connected in series with each of said magnetic memory cells, and said magnetic memory device measures a potential at a connection point between one terminal of a magnetic memory cell selected by one of said first lines and one of said second lines and said voltage reading unit at a predetermined timing, and decides a voltage level of this potential, thereby to read data of this magnetic memory cell.

* * * * *

UNITED STATES PATENT AND TRADEMARK OFFICE
CERTIFICATE OF CORRECTION

PATENT NO. : 6,404,673 B1
DATED : June 11, 2002
INVENTOR(S) : Noriyuki Matsui

It is certified that error appears in the above-identified patent and that said Letters Patent is hereby corrected as shown below:

Column 23,
Line 44, change "the" to -- to --.

Column 24,
Line 9, change "means" to -- unit --.
Line 17, change "voltages" to -- voltage --.

Signed and Sealed this

Tenth Day of September, 2002

Attest:

Attesting Officer

JAMES E. ROGAN
Director of the United States Patent and Trademark Office